(12) United States Patent
Tatsukami

(10) Patent No.: US 8,009,423 B2
(45) Date of Patent: Aug. 30, 2011

(54) ELECTRONIC DEVICE

(75) Inventor: Ikki Tatsukami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 643 days.

(21) Appl. No.: 12/216,998

(22) Filed: Jul. 14, 2008

(65) Prior Publication Data
US 2009/0040742 A1 Feb. 12, 2009

(30) Foreign Application Priority Data

Aug. 9, 2007 (JP) ................................. 2007-208614

(51) Int. Cl.
G06F 1/16 (2006.01)
A47B 81/00 (2006.01)
H04M 1/00 (2006.01)
H01M 2/10 (2006.01)
H01R 13/64 (2006.01)

(52) U.S. Cl. ........... 361/679.58; 361/679.55; 312/223.2; 455/575.1; 429/97; 429/100; 439/374

(58) Field of Classification Search .......... 361/679.31–679.45, 679.55–679.59, 361/724–727, 679.01–679.3, 752, 756, 759, 361/740, 741; 312/223.1, 223.2; 211/26; 455/575.1; 439/326, 374, 377
See application file for complete search history.

(56) References Cited

U.S. PATENT DOCUMENTS

| | | | | |
|---|---|---|---|---|
| 5,095,405 A | * | 3/1992 | Ishida | 361/679.31 |
| 5,305,180 A | * | 4/1994 | Mitchell et al. | 361/679.37 |
| 5,311,455 A | * | 5/1994 | Ho | 361/679.37 |
| 5,675,524 A | * | 10/1997 | Bernard | 708/109 |
| 6,064,567 A | * | 5/2000 | Cheng | 361/679.31 |
| 6,185,103 B1 | * | 2/2001 | Yamada | 361/727 |
| 6,731,500 B2 | * | 5/2004 | Allirot | 361/679.34 |
| 6,788,529 B2 | * | 9/2004 | Homer et al. | 361/679.27 |
| 7,262,958 B2 | * | 8/2007 | Marroquin et al. | 361/679.33 |
| 7,453,691 B2 | * | 11/2008 | Zhao et al. | 361/679.33 |
| 7,711,401 B2 | * | 5/2010 | Lim | 455/575.8 |
| 2003/0110333 A1 | * | 6/2003 | Fuchida | 710/72 |
| 2003/0201970 A1 | * | 10/2003 | Liu | 345/156 |
| 2010/0046164 A1 | * | 2/2010 | Murakami | 361/679.55 |

FOREIGN PATENT DOCUMENTS

| | | |
|---|---|---|
| JP | 8-124607 | 5/1996 |
| JP | 9-246753 | 9/1997 |

* cited by examiner

Primary Examiner — Jayprakash N Gandhi
Assistant Examiner — Nidhi Desai
(74) Attorney, Agent, or Firm — Staas & Halsey LLP

(57) ABSTRACT

An electronic device is formed by a cabinet having a bottom surface and is equipped with a tabular electronic part. The electronic device has an undersurface guiding rib. The top surface of the undersurface guiding rib is formed by an inclined surface and a supporting surface. The inclined surface guides a front end of an undersurface of the electronic part when inserted. The supporting surface is formed beside the inclined surface and supports the front end of the undersurface of the electronic part that is guided by the inclined surface and made horizontal with a rear end of the electronic part made lowered. An overhanging piece is disposed at a position above the undersurface guiding rib and supports a top surface on the front end of the electronic part that is made horizontal with the undersurface of the electronic part supported by the supporting surface of the undersurface guiding rib.

12 Claims, 36 Drawing Sheets

ELECTRONIC DEVICE

BACKGROUND OF THE INVENTION

1. Field of the Invention

The present invention relates to an electronic device that has a cabinet having a surface on which a tabular electronic part is disposed parallel to the surface.

2. Description of the Related Art

An electronic device, as exemplified by a notebook personal computer (hereafter referred to as note PC), has multiple electronic parts incorporated therein.

One example of such an electronic device is an electronic part having a plate-like shape like a communication module in which circuit parts are mounted on a board. Preferably, such a tabular electronic part should be mounted in parallel to a surface of a cabinet of a note PC in order to make the note PC thin.

However, as high-density multiple electronic parts are mounted in the cabinet of the note PC and the size of the note PC should be minimized for portability, it is often difficult to leave a working clearance for incorporating a tabular electronic part in the cabinet, which deteriorates assembling performance.

In this regard, Japanese Patent Application Publication No. 9-246753 discloses a printed board holding structure, and Japanese Patent Application Publication No. 8-124607 discloses an earth spring device disposed between two boards that are separated and interposed by a frame. However, both techniques have nothing to do with difficulty in installation of a tabular electronic part.

SUMMARY OF THE INVENTION

In view of the above circumstances, the present invention provides an electronic device that is capable of easing installation of a tabular electronic part.

An electronic device according to the present invention is formed by a cabinet having a surface, and includes:

an undersurface guiding rib that guides a front end of an undersurface of a tabular electronic part, a top surface of the undersurface guiding rib being formed by an inclined surface and a supporting surface, the inclined surface extending in the direction across the surface of the cabinet and being inclined in a moving direction of the electronic part toward the surface of the cabinet, the supporting surface being formed at a position upstream in the moving direction of the electronic part toward the inclined surface and supporting the front end of the undersurface of the electronic part when the electronic part is guided by the inclined surface and made horizontal with a rear end of the electronic part made lowered; and an overhanging piece that is disposed at a position above the undersurface guiding rib and supports a top surface on the front end of the electronic part that is made horizontal with the undersurface of the electronic part being supported by the supporting surface of the undersurface guiding rib.

As the electronic device of the present invention is provided with the undersurface guiding rib, the inclined surface of the top surface of the undersurface guiding rib guides the tabular electronic part that is moved so as to be inserted from obliquely above, and the supporting surface of the top surface supports the inserted electronic part such that the electronic part is kept horizontal. Further, the overhanging piece supports the top surface of the electronic part.

Accordingly, it is possible to easily incorporate the tabular electronic part without much working clearance.

Preferably, a plate member is provided that extends on the surface of the cabinet and that has an opening in which the electronic part is placed, wherein the undersurface guiding rib is disposed in the cabinet at a position near an end edge defined by the opening, and the plate member has the overhanging piece that overhangs toward the inside of the opening from the end edge.

As described above, it is possible for the plate member with the opening formed therein to serve a function of holding the top surface of the electronic part. Accordingly, easy incorporation of the electronic part is enabled with a simple structure having decreased number of parts.

Further preferably, the overhanging piece is in such a shape that a tip of the overhanging piece is bent obliquely upward.

As the tip of the overhanging piece is bent obliquely upward, it becomes further easy to insert the electronic part from obliquely above.

Additionally, the undersurface guiding rib may further has an abutment wall, at the bottom of the inclined surface, against which a tip of the electronic part guided by the inclined surface abuts.

Presence of the abutment wall makes it aware instantly that the inserted electronic part reaches a right position, which enhances assembling efficiency.

Further, it is preferable that the undersurface guiding rib is formed by a pair of undersurface guiding ribs that guide the undersurface of the electronic part to positions respectively near side surfaces of the electronic device.

The pair of undersurface guiding ribs facilitates a smooth guidance of the electronic part so as to be inserted.

It is also preferable to provide a pair of side surface guiding ribs that guide right and left side surfaces on the front end side of the electronic part guided by the inclined surface.

The pair of side surface guiding ribs enables correct positioning of right and left sides of the electronic part when inserted.

Here, it is preferable that the side surface guiding ribs further have guide walls that guide the side surfaces of the electronic part and extend parallel to each other, and introduction walls that are formed continuous to the guide walls at a position distant from the end edge of the opening further than the guide walls are and open mutually toward a direction away from the end edge, and guide the side surfaces of the electronic part to the guide walls.

Presence of the guide walls on the side surface guiding ribs enables correct positioning of the electronic part in the right and left sides even when the electronic part is inserted with its right and left sides off the correct positions.

Accordingly, it is possible to further facilitate assembly work.

Further preferably, the electronic part includes a fixing through hole formed in the rear end of the electronic part, and the cabinet further comprises a boss with a screw hole formed therein that stands at a position corresponding to the through hole when the electronic part is placed in the cabinet, and the electronic part is fixed by a screw member that is passed through the through hole and screwed into the screw hole of the boss.

As the electronic part of the present invention is provided with the undersurface guiding ribs and overhanging piece, it is possible to easily fix the electronic part to the cabinet by screwing only the rear end of the electronic part.

Additionally, the plate member may have an opening that extends over the boss and is formed in a position corresponding to the screw hole of the boss through which the screw member is inserted.

Such a mechanism makes it possible to fix the plate member by fixing the electronic part.

Further, the plate member may be a sheet metal member.

The plate member formed of a sheet metal makes the electronic device lighter and thinner. In addition, the plate member can serve as a shield.

Further, the electronic device according to the present invention may include an arithmetic processing unit that incorporates an arithmetic circuit performing arithmetic processing and that is provided, on a top surface thereof, with a keyboard that inputs instructions according to operations, wherein the cabinet is a cabinet of the arithmetic processing unit. In addition, the electronic device may further include a display unit that has a display screen displaying information and that is connected to the arithmetic processing unit so as to be capable of being opened and closed.

As described above, it is possible to preferably apply the present invention to a note PC.

DETAILED DESCRIPTION OF THE INVENTION

An embodiment of the present invention will be described below. The following description will be given of a notebook PC, which is an example of the electronic device of the present invention.

(General Configuration)

Figure 1:
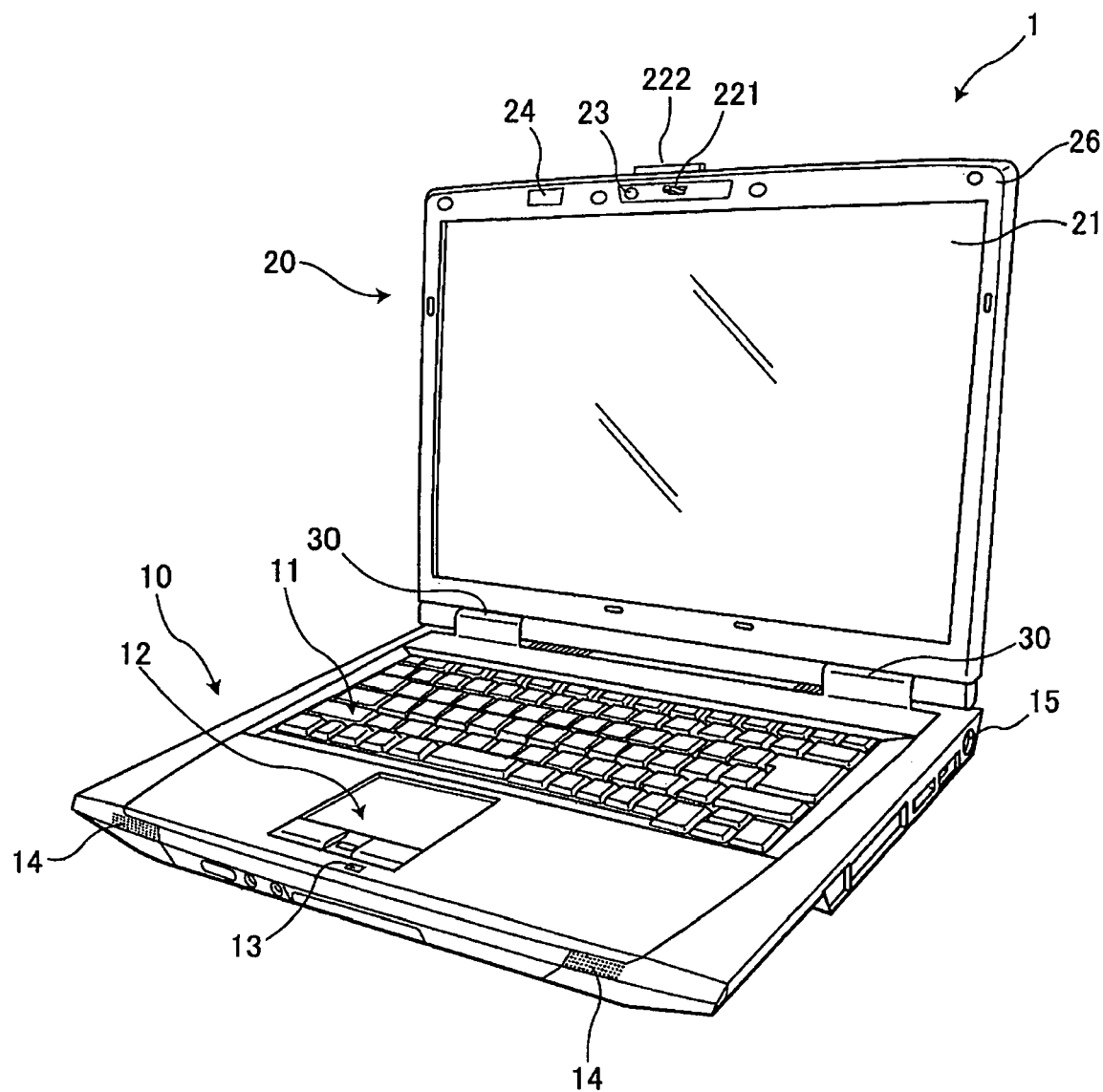
FIG. 1 is a perspective view showing the appearance of a notebook PC in an open condition.
Figure 2:
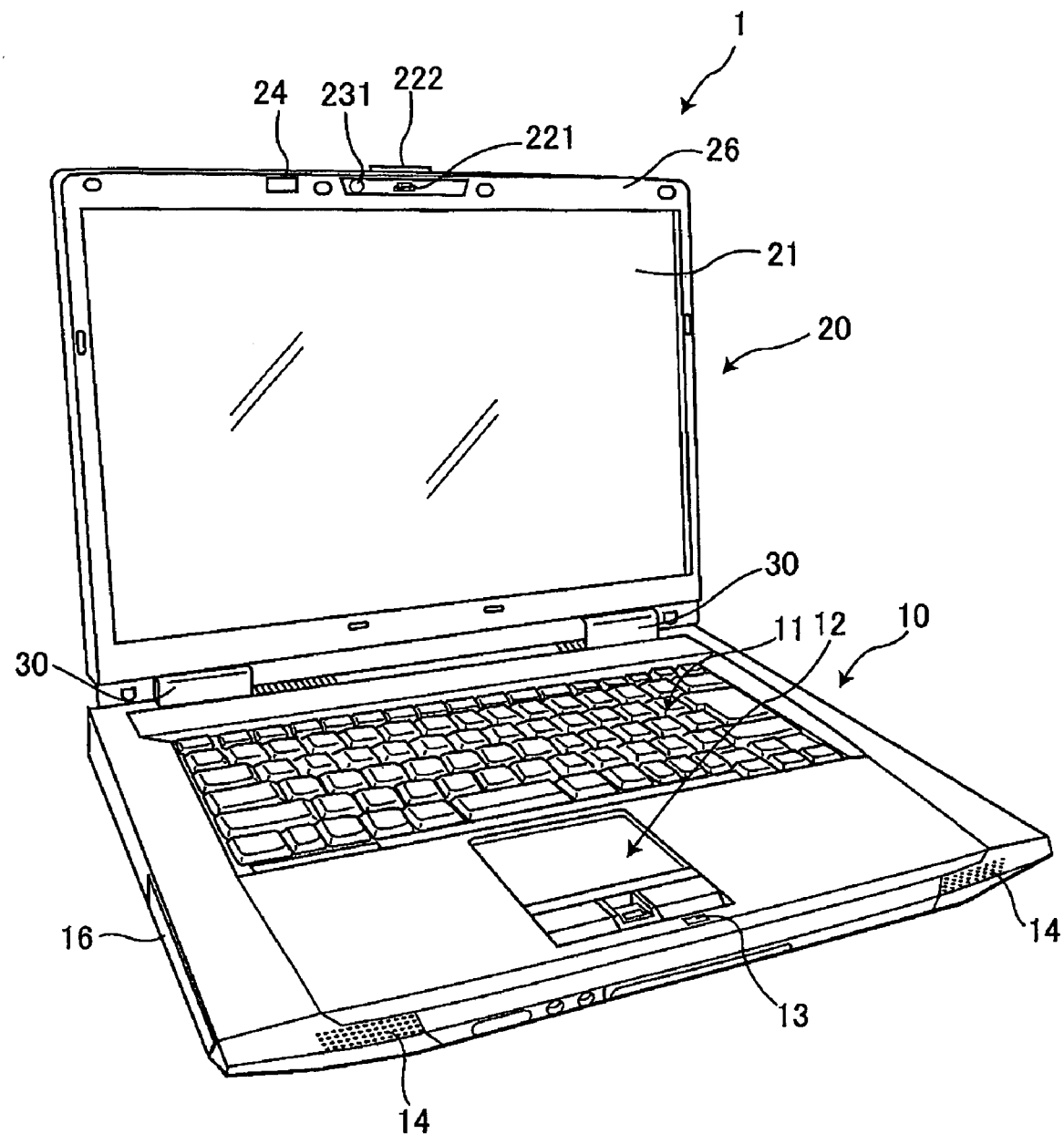
FIG. 2 is a perspective view showing the appearance of the notebook PC in an open condition.
Figure 3:
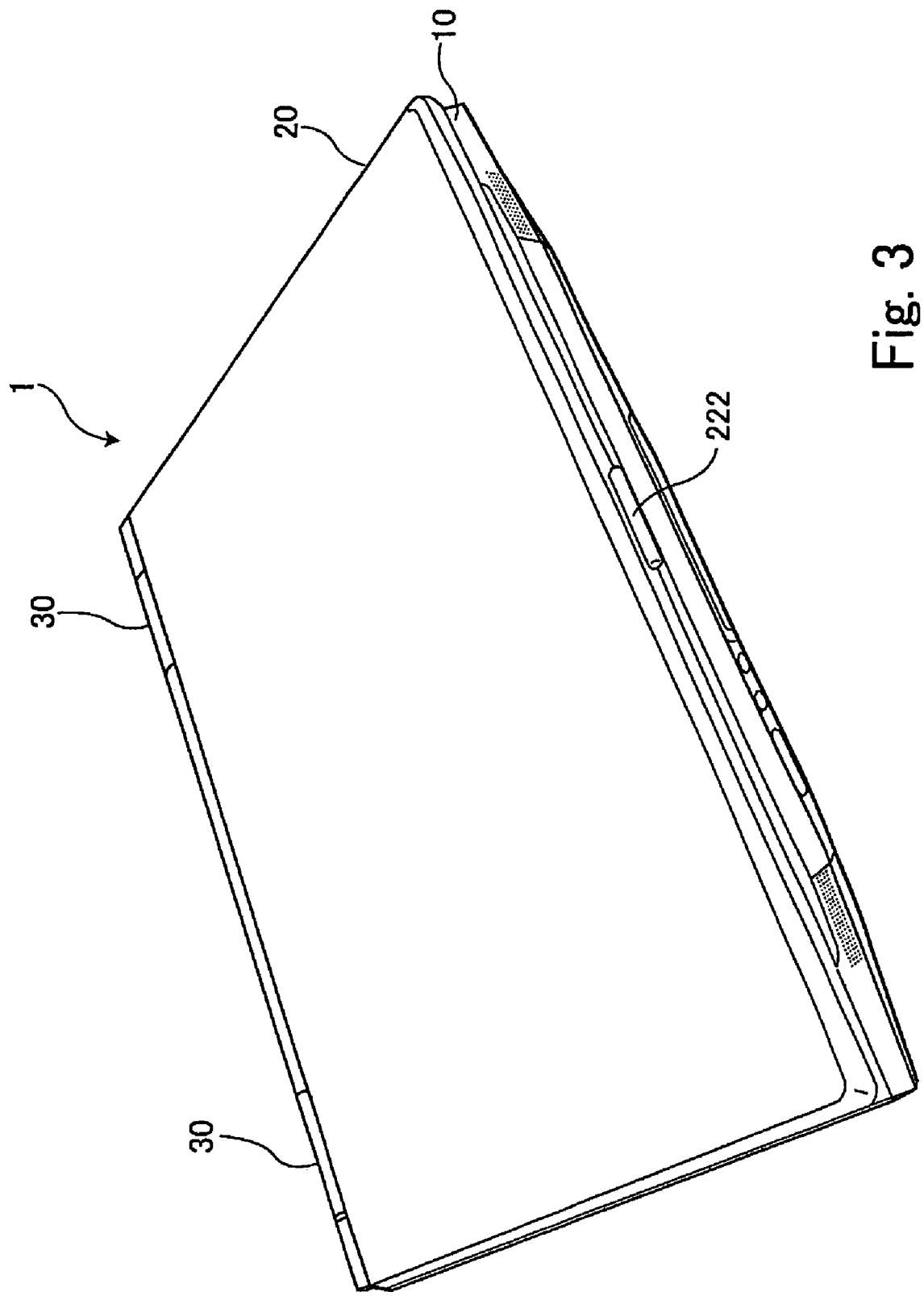
FIG. 3 is a perspective view showing the notebook PC in a closed condition.
Figure 4:
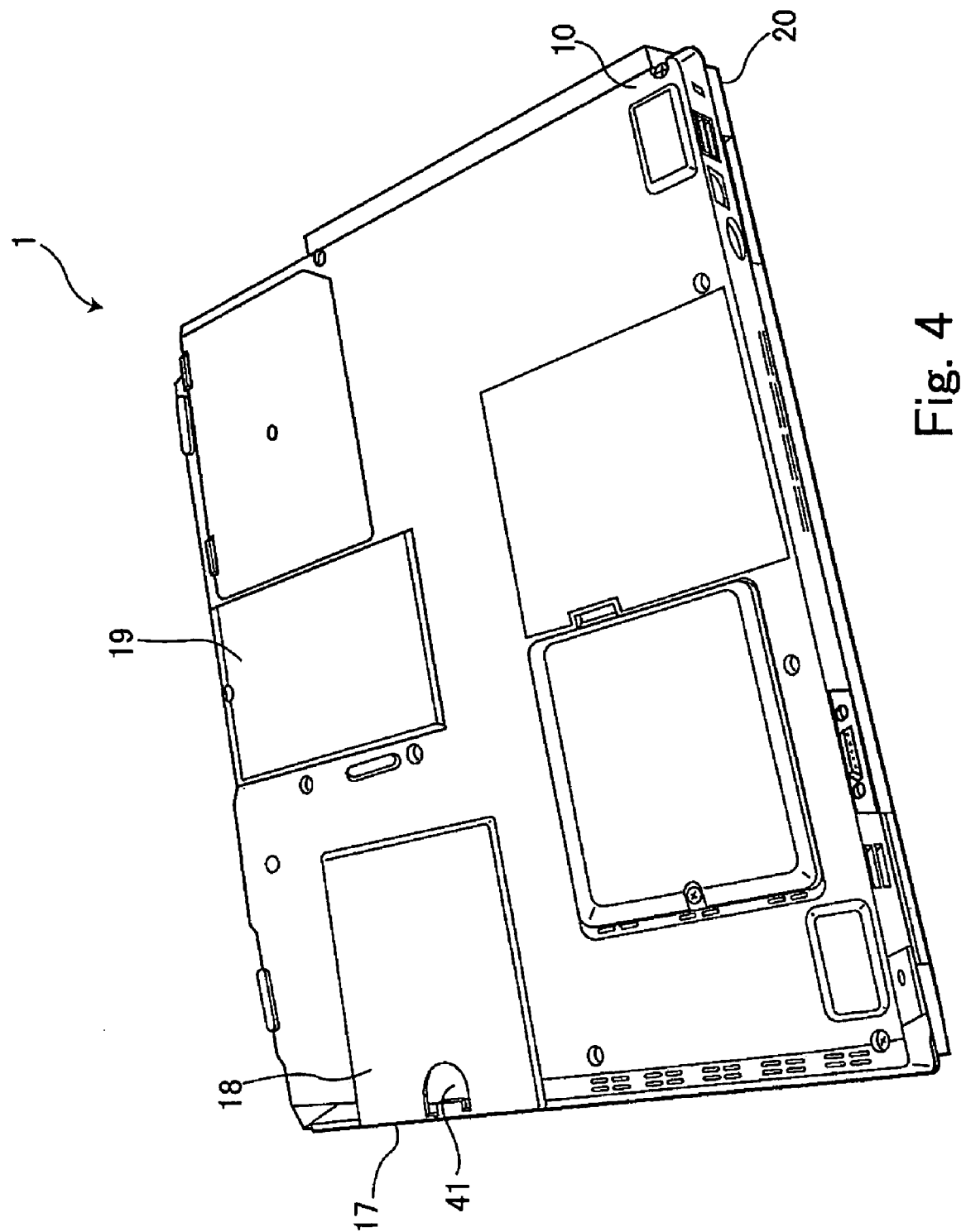
FIG. 4 is a perspective view showing the bottom surface side of the notebook PC in a closed condition.

FIGS. 1 and 2 are perspective views of the appearance of a notebook PC, showing an open condition as viewed from different directions. FIG. 3 is a perspective view showing the notebook PC in a closed condition. And FIG. 4 is a perspective view showing the bottom surface side of the notebook PC in a closed condition.

This notebook PC 1 is composed of a main unit 10 and a display unit 20, and the display unit 20 is connected so as to be able to open and close between a closed condition in which the display unit 20 is superposed on the main unit 10 (see FIG. 3) and an open condition in which the display unit 20 is opened from the main unit 10 by a hinge portion 30 (see FIGS. 1 and 2).

The main unit 10 is provided, on the top surface thereof, with a keyboard 11 for inputting instructions responding to operations, a track pad 12 which is one kind of a pointing device that indicates any point on a display screen 21, which will be described later, in response to operations, and an engaging hole 13 that a locking hook 221 enters.

On the right and left front parts of this main unit 10, sound releasing ports 14 that output sound from a built-in speaker to the outside are formed a little obliquely upward.

Furthermore, on the right side surface of this main unit 10, as shown in FIG. 1, a power supply input terminal 15 for external power supply connection and other multiple connectors and the like are arranged and on the left side surface, as shown in FIG. 2, there is exposed a surface of a CD/DVD drive unit 16, which drives a loaded medium such as a CD and a DVD. In a position in superposed relation with this CD/DVD drive unit 16 on the left side surface in the thickness direction, there is formed a card slot into which a B-CAS card (a BS-conditional access systems card) is to be inserted, which is not illustrated here (which will be described later).

A CPU and many other electronic parts are built in this main unit 10, and various kinds of arithmetic processing are performed by executing programs.

The display unit 20 has, on the front surface thereof, a display screen 21 for information display that constitutes a display panel, and the periphery of the display screen 21 is covered with a front frame 26. A hook 221 for locking protrudes from the front frame 26 in a position above a top edge of the display screen 21 of the front of the display unit 20. This hook 221 enters the engaging hole 13 on the top surface of the main unit 10 when the display unit 20 is closed on the main unit 10, and is locked within the engaging hole 13 so that the display unit 20 does not open accidentally from the main unit 10.

Upon the top end surface of this display unit 20 is arranged an operating element 222 for unlocking, and when this operating element 222 is depressed, the hook 221 moves in the unlocking direction. By depressing this operating element 222 when the display unit 20 is in the closed condition shown in FIG. 3, the hook 221 is released from the engaging hole 13 and the display unit 20 can be opened.

A photographing window 23 from which a lens of a camera module, which will be described later, makes an appearance, is provided in a position of the display unit 20 above the top edge of the display screen 21 and in side-by-side relation with the hook 221. This photographing window 23 is constructed in such a manner that the front surface of a hole provided in the cabinet where the camera module is to be disposed is covered with a transparent acrylic plate or the like. Furthermore, an infrared receiving window 24 for infrared communication is formed beside this photographing window 23.

Furthermore, as shown in FIG. 4, upon the bottom surface of the main unit 10, as components necessary for later descriptions, there are disposed a card housing section 18 that houses a B-CAS card 41, which is inserted from a card slot 17 so as to be capable of being inserted and extracted, and a lid 19 that covers an HDD housing section in which a hard disk drive (hereinafter called HDD) unit is loaded.

(Superstructure of Display Unit)

Figure 5:
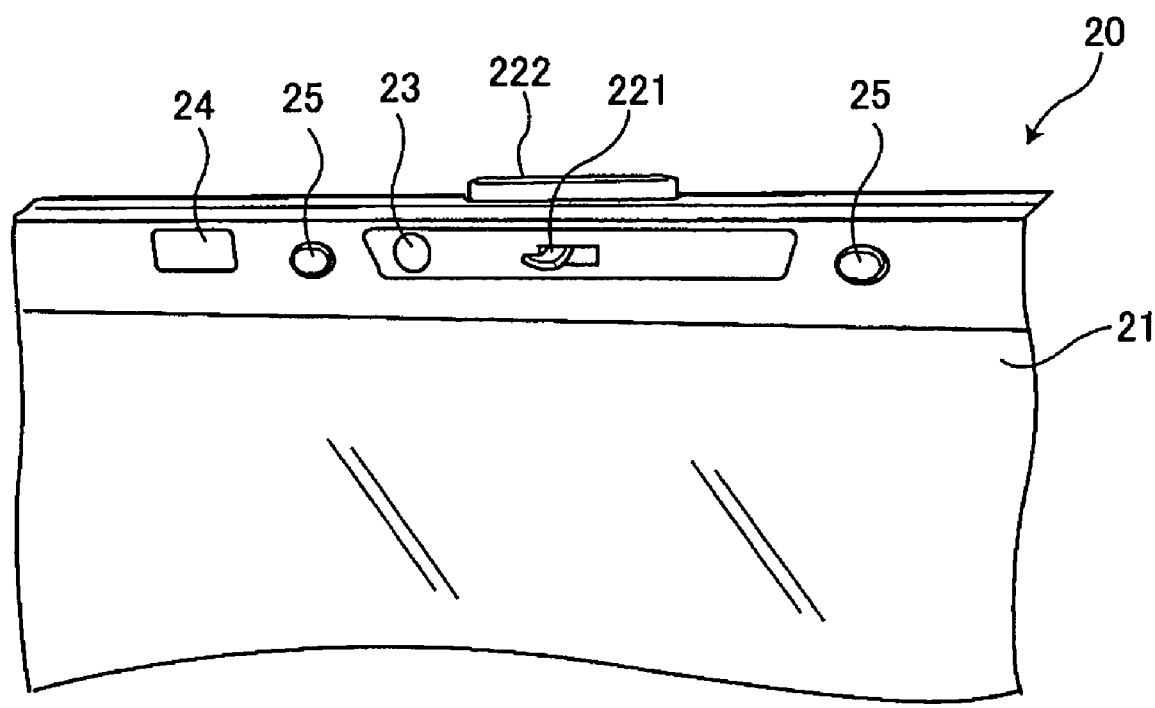
FIG. 5 is a diagram showing an enlarged upper middle part of the front of a display unit.

FIG. 5 is a diagram showing an enlarged upper middle part of the front of the display unit.

In a position above the top edge of the display screen 21, the hook 221 for locking protrudes to the front of the display unit 20, and the top end surface of the display screen 21 is provided with the operating element 222 for unlocking in a protruding condition. The photographing window 23 from which a lens of a camera module, which will be described later, makes an appearance, is formed in a position of the front of the display unit 20 adjacent to the hook 221. This photographing window 23 is covered with a transparent acrylic plate or the like. Furthermore, the infrared receiving window 24 is also provided beside this photographing window 23.

Furthermore, pads 25 that hide screw heads used in screwing the front frame constituting the display unit 20 are seen here.

Figure 6:
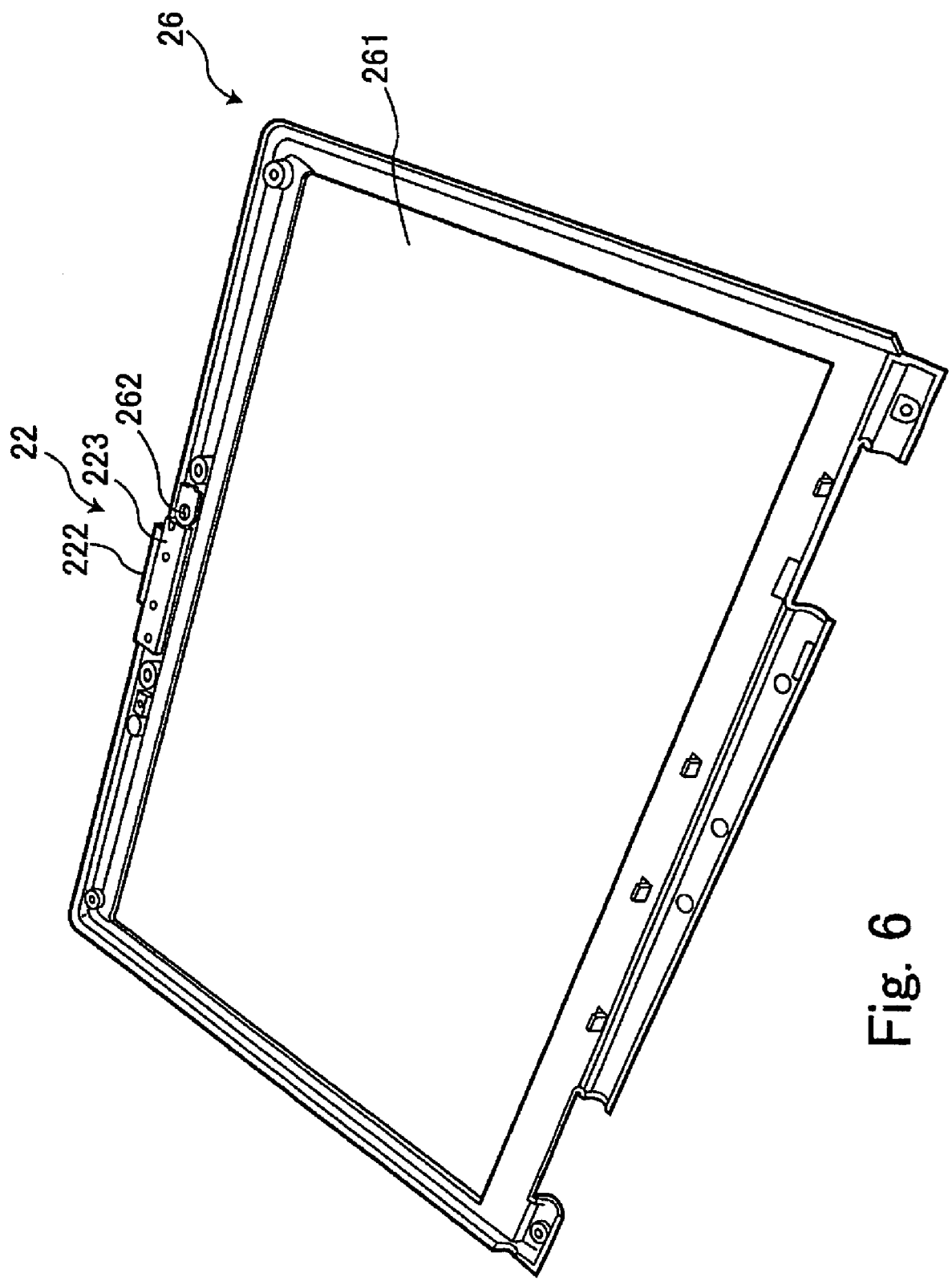
FIG. 6 is a perspective view of a front frame covering the periphery of a display screen as viewed from the side of an inner wall surface of the front frame.
Figure 7:
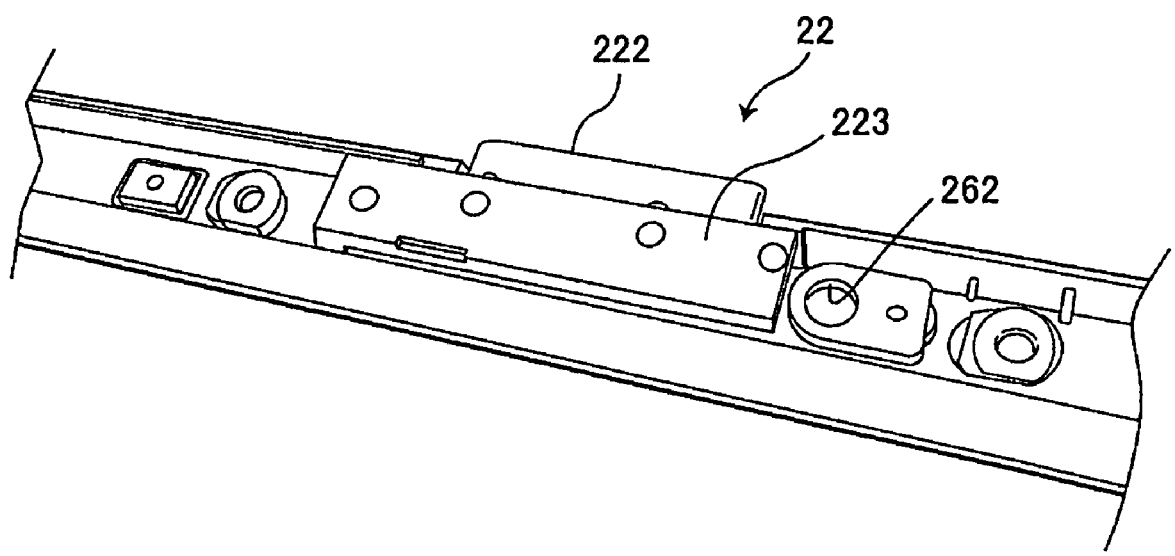
FIG. 7 is an enlarged view showing the upper middle part of the inner wall surface of the front frame.
Figure 8:
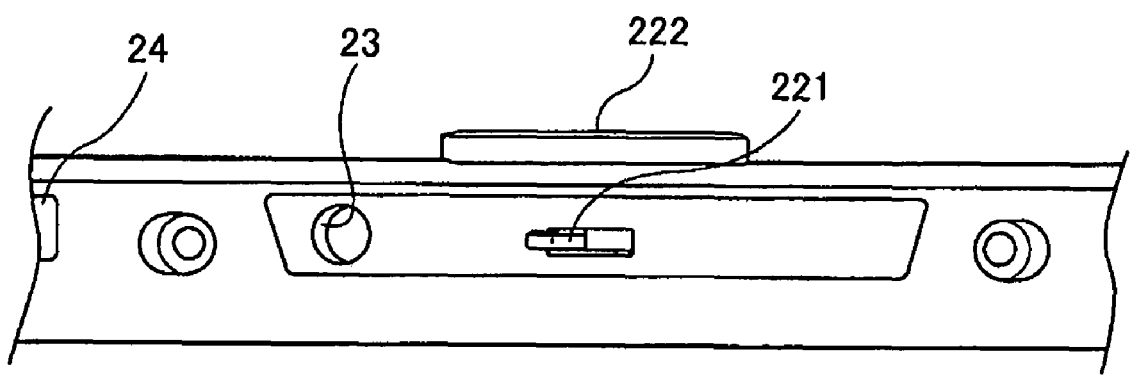
FIG. 8 is an enlarged view showing an upper middle part of an outer wall surface of the front frame.

FIG. 6 is a perspective view of the front frame covering the periphery of the display screen 21 as viewed from the side of an inner wall surface of the front frame. FIG. 7 is an enlarged view showing an upper middle part of the inner wall surface of the front frame 26. And FIG. 8 is an enlarged view showing an upper middle part of the outer wall surface of the front frame 26.

This front frame 26 is a member that forms the front of the display unit 20 (see FIGS. 1 and 2) at the periphery of the display screen 21 in such a manner that the display screen 21 is exposed from an opening 261 in the middle of the front frame 26.

In the upper middle part of the inner wall surface of this front frame, there is provided, in addition to the hook 221 (see FIG. 8) and the operating element 222, a lock module 22 having a connecting mechanism section 223 that transmits the operation of the operating element 222 to the hook 221. This connecting mechanism section 223 assumes the role of transmitting the operation to the operating element 222 as an action of disengagement of the hook 221.

On the right-hand part of this lock module 22 in FIG. 7 (on the left-hand part in FIG. 8), there is formed a lens loading hole 262 leading to the photographing window 23 into which a lens of the camera module is loaded.

Figure 9:
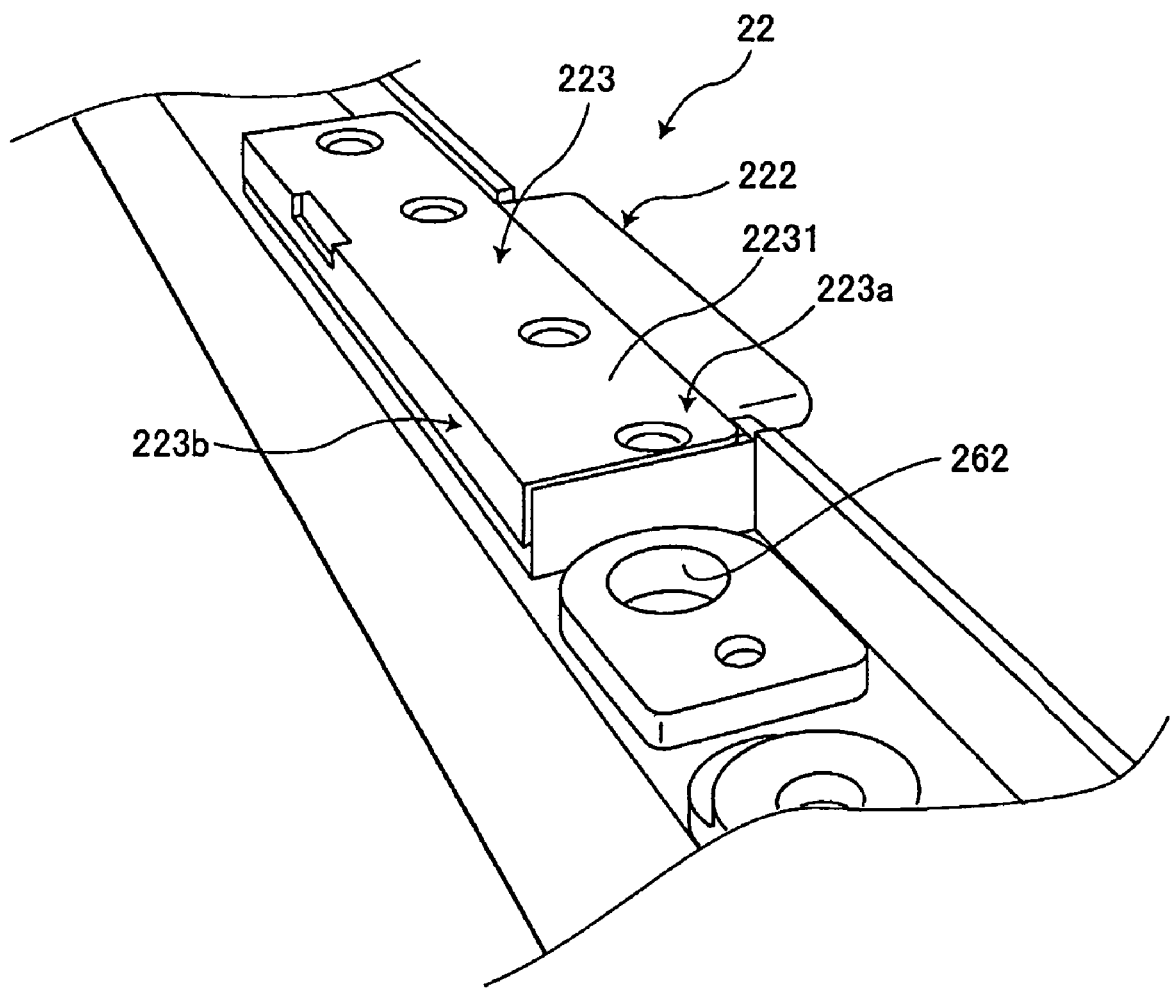
FIG. 9 is an enlarged perspective view of the upper middle part of the inner wall surface of the front frame as obliquely viewed.

FIG. 9 is an enlarged perspective view of the upper middle part of the inner wall surface of the front frame as obliquely viewed.

As is apparent from FIG. 9, the connecting mechanism section 223 that constitutes the lock module 22 is covered with a metal plate 2231 bent in the form of the letter L so that the metal plate 2231 extends into a surface 223*a* in superposed relation with a substrate, which will be described later, and a surface 223*b* perpendicular to this surface 223*a*.

This L-shaped metal plate 2231 has the roles of both ensuring the strength of this connecting mechanism section 223 and cooling a heat-generating electronic part mounted on a substrate, which will be described later.

Figure 10:
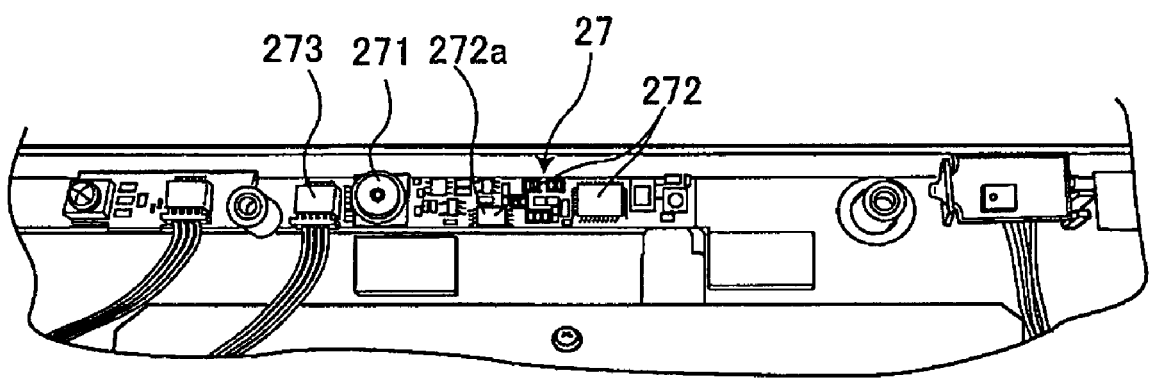
FIG. 10 is a view of the upper middle part of a display unit from which the front frame was removed.

FIG. 10 is a view of the upper middle part of the display unit from which the front frame was removed.

In this part, the camera module 271 is fixed and furthermore, there is disposed a substrate 27 on which a large number of electronic parts 272 that constitute a signal processing circuit for this camera module 271 are mounted. The signal processing circuit on this substrate 27 is electrically connected to the outside of this substrate via a connector 273.

One electronic part 272*a* belonging to the many electronic parts 272 that constitute this signal processing circuit is a heat-generating electronic part that generates considerable heat during operation.

When the front frame 26 shown in FIG. 6 is attached, the camera module 271 is inserted into the lens loading hole 262 (see FIG. 9) and a lens makes an appearance from the photographing window 23 (see FIG. 8). Also, the region of the substrate 27 where the electronic parts 272 are mounted is disposed in a position in superposed relation with the connecting mechanism section 223 of the lock module 22. At this time, the L-shaped metal plate 223 shown in FIG. 9 approaches the electronic parts 272 on the substrate 27 and is disposed so as to cover these electronic parts 272. As a result of this, the L-shaped metal plate 223 assists the heat-generating electronic part 272a in the heat release thereof and serves also as a shield for these electronic parts 272.

In this embodiment, as described above, the connecting mechanism section 223 and the substrate 27 are disposed in a position in superposed relation in the thickness direction and, therefore, the hook 221 constituting the lock module 22 and the photographing window 23 are disposed in positions close to each other in the upper middle part of the display unit 20.

(Card Access Unit)

Figure 11:
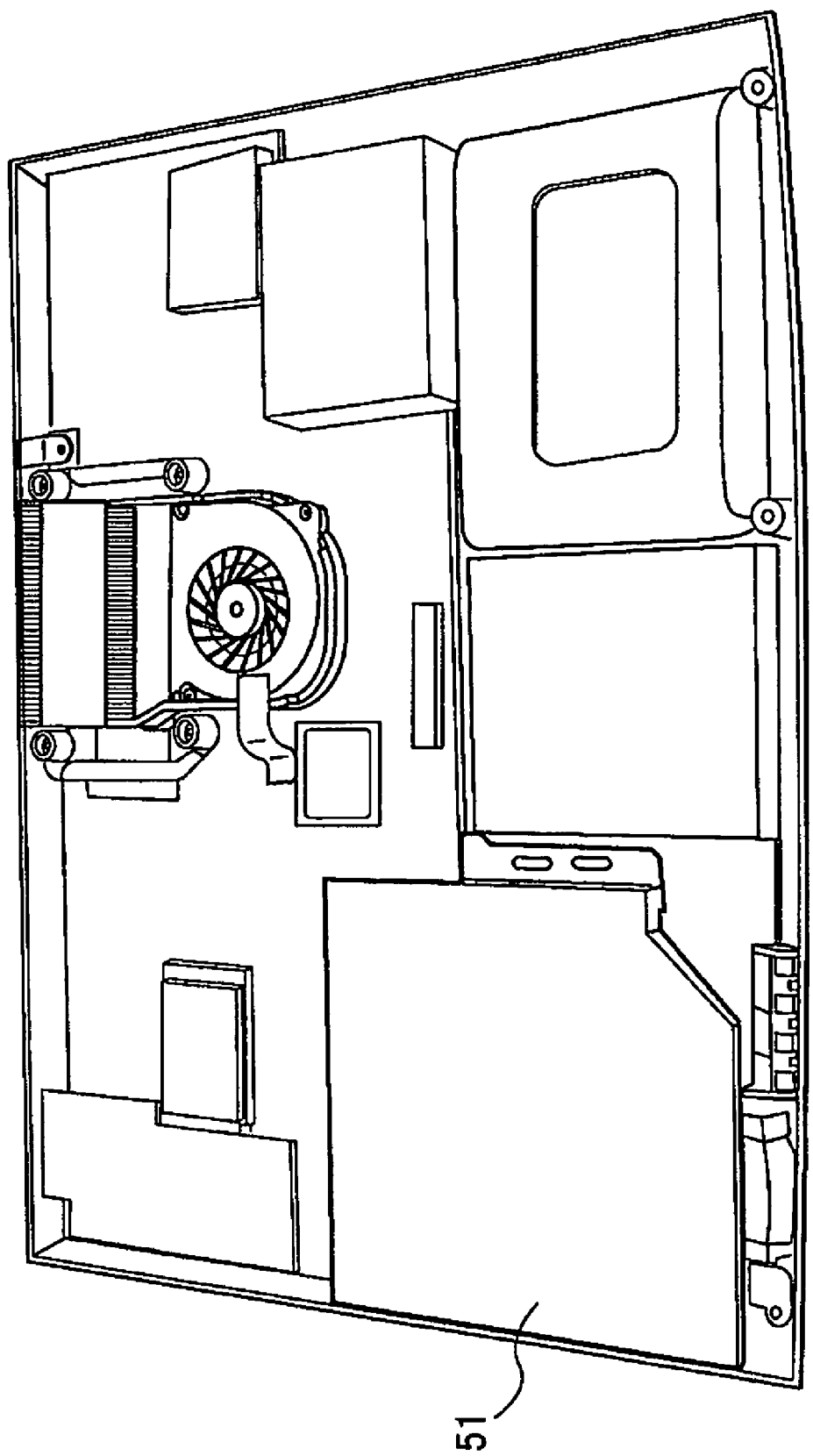
FIG. 11 is a perspective view showing the interior of a cabinet on the bottom surface side after the removal of components on a top surface, such as a keyboard of a main unit.

FIG. 11 is a perspective view showing the interior of the cabinet on the bottom surface side after the removal of components on the top surface, such as the keyboard 11 of the main unit 10.

A large number of electronic parts are mounted within the cabinet on the bottom surface side that constitutes the main unit 10. A CD/DVD drive unit 51 is mounted here as one of these electronic parts.

Figure 12:
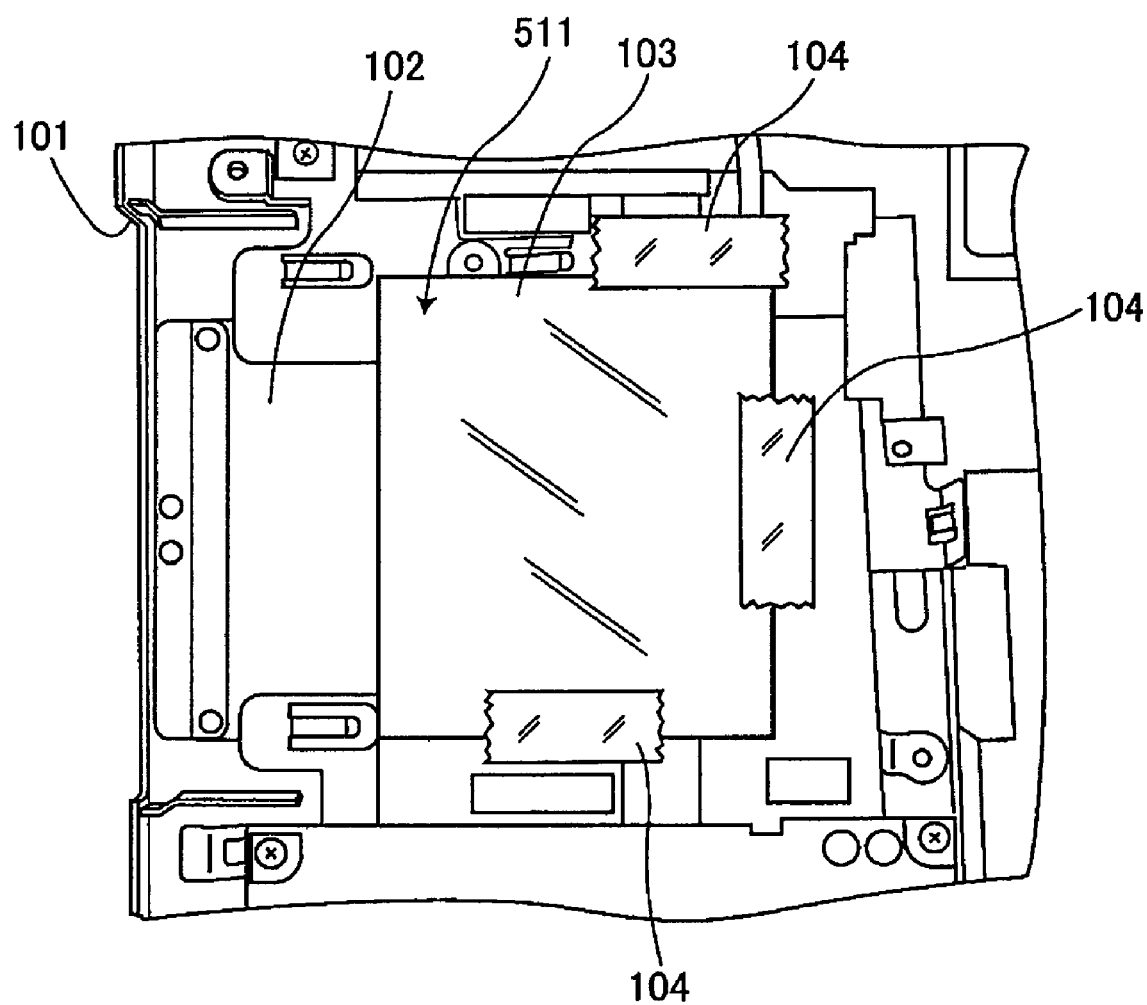
FIG. 12 is a diagram showing a part from which a CD/DVD drive unit was removed.

FIG. 12 is a diagram showing a part from which the CD/DVD drive unit 51 was removed.

The CD/DVD drive unit 51 shown in FIG. 11 is an electronic part that is loaded into a CD/DVD drive unit loading section 511 from an electronic part loading port 101 provided in the cabinet constituting the main unit 10 so as to be capable of being loaded and unloaded. Once the CD/DVD drive unit 51 has been loaded, the CD/DVD drive unit 51 is not removed during ordinary use. However, in case of failure and the like, the CD/DVD drive unit 51 can be removed from the electronic part loading port 101. This CD/DVD drive unit 51, as loaded from the electronic part loading port 101, stops up the opening of the electronic part loading port 101, and the surface of the CD/DVD drive unit 51 forms part of the cabinet defining the outside shape of the main unit 10.

A shield plate 102 is laid on the CD/DVD drive unit loading section 511, and the CD/DVD drive unit 51 that is loaded from the electronic part loading port 101 is placed on this shield plate 102.

Upon this shield plate 102, an insulating sheet 103 is laid and is stuck with adhesive tape 104.

Figure 13:
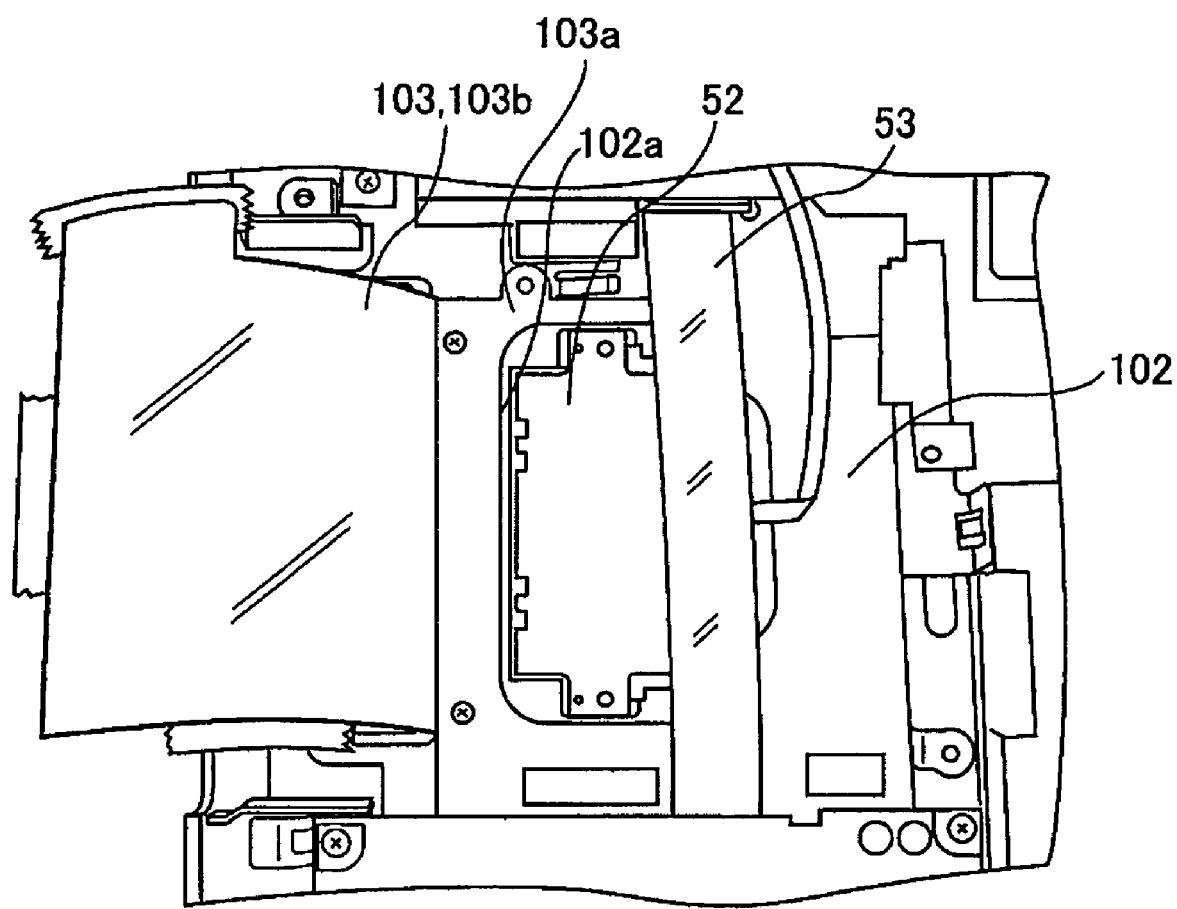
FIG. 13 is a diagram showing a CD/DVD drive unit loading section in which a sheet is caused to extend by stripping adhesive tape.

FIG. 13 is a diagram showing the CD/DVD drive unit loading section 511 in which the sheet 103 is caused to extend by stripping the adhesive tape 104.

An opening 102a is formed in the shield plate 102, and a card access unit 52 is disposed in a position inside this opening 102a.

A flat cable 53 that connects two circuit boards extends over the shield plate 101.

The sheet 103 has a fixed portion 103a that is fixed to the shield plate 102 and a folded-back portion 103b that is folded back in a position near the electronic part loading port 101 and extends on the fixed portion 103a. When the folded-back portion 103b is folded back (see FIG. 12), the flat cable 53 becomes sandwiched between the fixed portion 103a and folded-back portion 103b of the sheet 103, and the opening 102a of the shield plate 102 and the card access unit 52 become covered with the folded-back portion 103b. Therefore, during loading and unloading, the CD/DVD drive unit 51 can be smoothly loaded and unloaded without damage or break by being caught in the edge of the opening 102a of the shield plate 102, the card access unit 52 and the flat cable 53.

Figure 14:
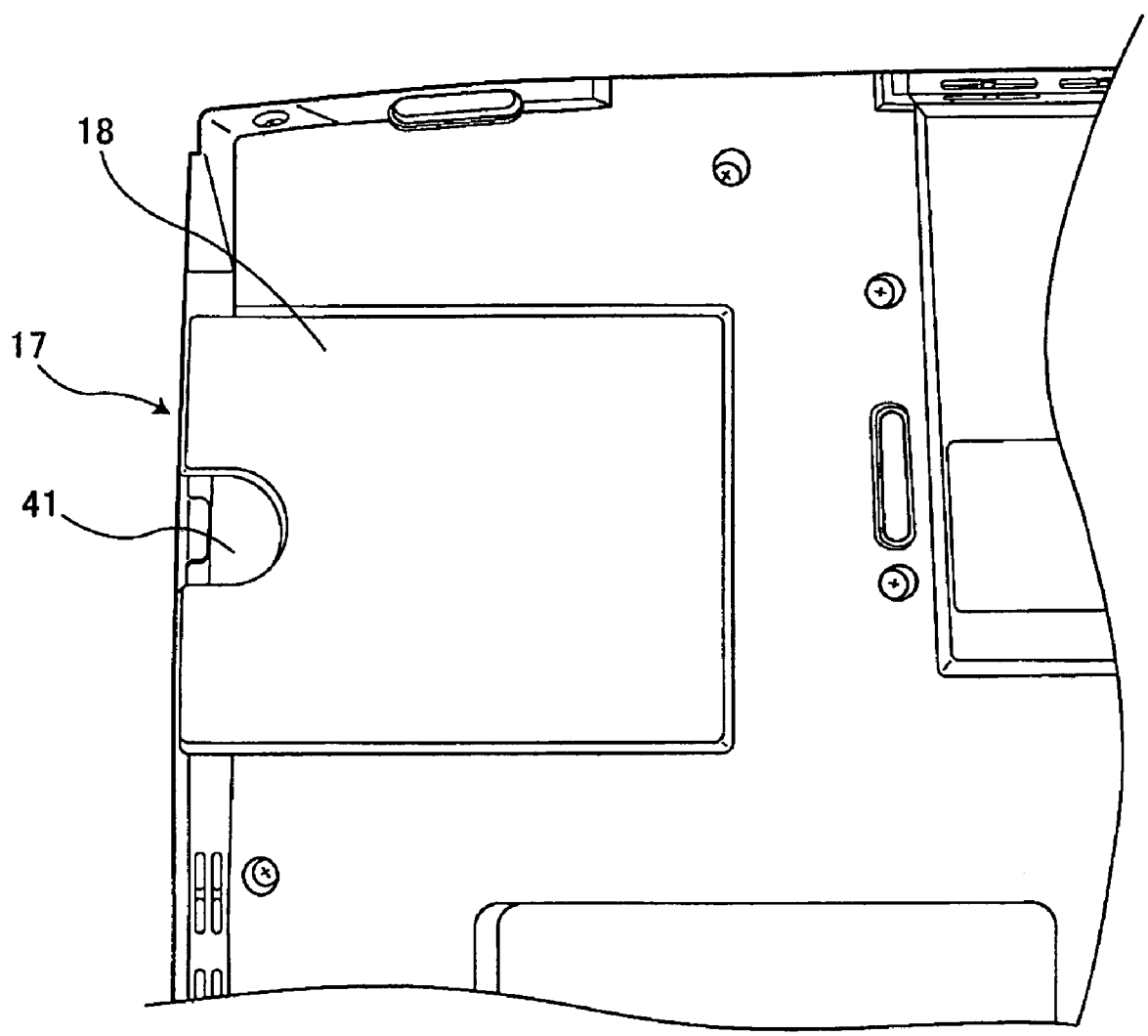
FIG. 14 is a partially enlarged view of a bottom surface of the main unit.

FIG. 14 is a partially enlarged view of the bottom surface of the main unit 10.

Upon this bottom surface, also as shown in FIG. 4, there is formed the card housing section 18 that houses the B-CAS card 41, which is inserted from the card slot 17, which is formed in one end surface of the cabinet of the main unit 10, so as to be capable of being inserted and extracted.

Figure 15:
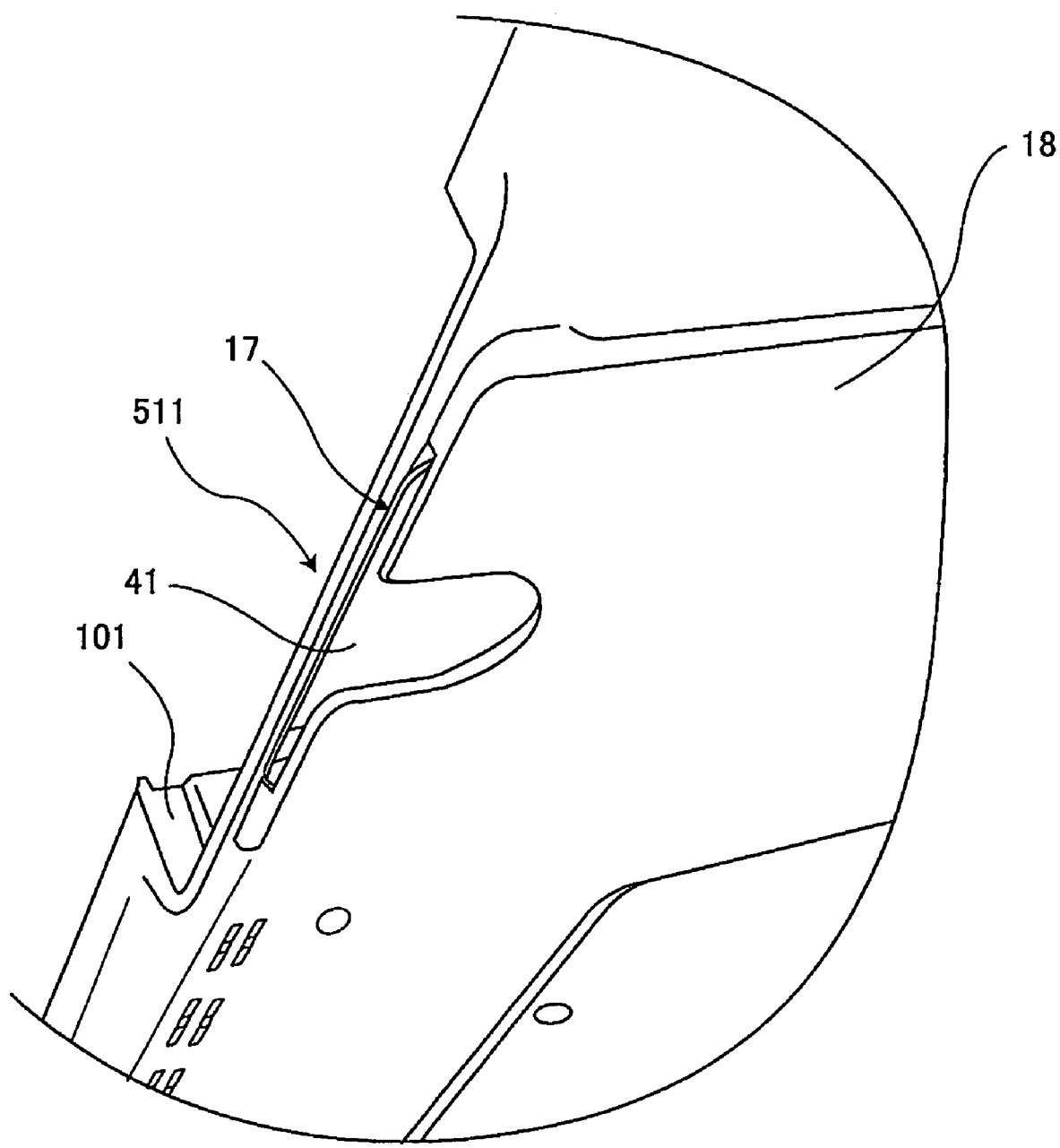
FIG. 15 is a partial perspective view of a card slot portion of a part of the cabinet constituting the main unit on the bottom surface side, where a B-CAS card is to be inserted.

FIG. 15 is a partial perspective view of a card slot portion of a part of the cabinet constituting the main unit on the bottom surface side, where the B-CAS card is to be inserted.

As shown in FIG. 15, this card slot 17 is formed in a position in superposed relation with the electronic part loading port 101 (see also FIG. 12), into which the CD/DVD drive unit is to be loaded, in the thickness direction of the main unit 10, and the card housing section 18 is formed in a position in superposed relation with the CD/DVD drive unit loading section 511, into which the CD/DVD drive unit 51 is to be loaded.

Figure 16:
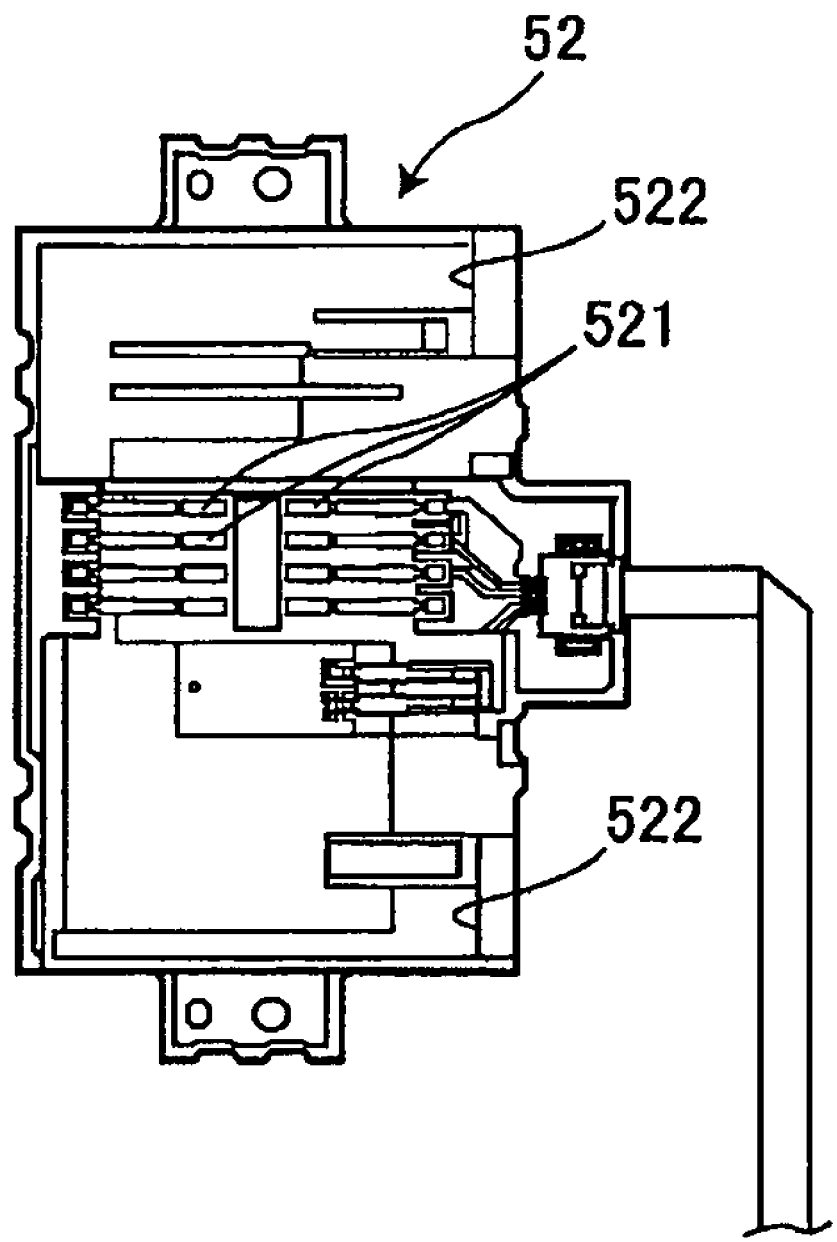
FIG. 16 is a diagram showing a surface on the side where contacts of a card drive unit are disposed.

FIG. 16 is a diagram showing a surface on the side where contacts of the card access unit 52 are disposed (in this embodiment, this surface is called an inner surface).

Upon this surface, multiple contacts 521 are provided. In the B-CAS card 41 inserted from the card slot 17, electrodes (not shown) are formed in places corresponding to these contacts 521 on the front end side of the insertion direction of the B-CAS card 41, and the B-CAS card 41 inserted from the card slot 17 abuts against a positioning wall 522 and stops. In this condition, the contacts 521 come into contact with the electrodes of the B-CAS card 41, and the B-CAS card 41 is accessed by this card access unit 52 via the contacts 521.

The rear surface on the back side of the inner surface of this card access unit 52 shown in FIG. 16 enters the opening 102a of the shield plate 102 shown in FIG. 13. As is apparent from FIG. 13, this card access unit 52 is fixed in a position that is spaced from the card slot 17 within the cabinet of the main unit 10 and a little back, and the B-CAS card 41 inserted from the card slot 17 is inserted into a position where only the leading end portion thereof is superposed on the card access unit 52.

Because the card access unit 52 is provided in a position spaced from the card slot 17 and a little back, it is necessary for the card access unit 52 to correctly guide the B-CAS card 41 inserted from the card slot 17 toward the card access unit 52. In this embodiment, the shield plate 102 laid under the CD/DVD drive unit 51 has a stepped form for guiding a card. Thus, it is possible to correctly guide the B-CAS card 41 inserted from the card slot 17 to the card access unit 52 by the shield plate 102 in conjunction with the inner wall of the card housing section 18 of the cabinet on the bottom surface side of the main unit 10. In this embodiment, therefore, it is unnecessary to arrange excess parts for guiding the card, because the shield plate 102, which is necessary from the beginning, is used as a guide plate. Accordingly, as the card is guided by the shield plate 102 in conjunction with the cabinet, the guiding function is realized without a cost rise due to an increase in the number of parts and an increase in size.

The card access unit 52 is disposed in such a manner that the inner surface thereof shown in FIG. 16 directly faces the inner surface of the cabinet on the bottom surface side of the main unit 10. Usually, such a card access unit 52 is provided with another plate member that faces this inner surface so as to surround the B-CAS card 41 in conjunction with the inner surface shown in FIG. 16. In this embodiment, however, such a plate member is unnecessary and the B-CAS card 41 inserted into the card access unit 52 is surrounded by the inner surface of the card access unit 52 shown in FIG. 16 and the inner wall surface of the cabinet. Therefore, this embodiment contributes to thin designs by saving such a plate member.

Furthermore, as shown in FIG. 13, the opening 102a is formed in the shield plate 102, and the card access unit 52 is disposed in such a manner that the rear surface side thereof enters the opening 102a.

Therefore, in this embodiment, it is also possible to make the thickness of the shield plate 102 thinner.

Incidentally, in the above-described embodiment, the CD/DVD drive, the shield plate, the card slot unit, and the bottom surface of the cabinet of the main unit are stacked in this order from above and, therefore, the description was given of the case where a card is guided by the shield plate 102 in conjunction with the bottom surface of the cabinet of the main unit. However, in the case where the card slot unit is provided near the top surface of the cabinet of the main unit with a reverse stacking structure, as opposed to this embodiment, it is needless to say that a card may be guided by the shield plate in conjunction with the top surface of the cabinet of the main unit.

(Speaker)

Figure 17:
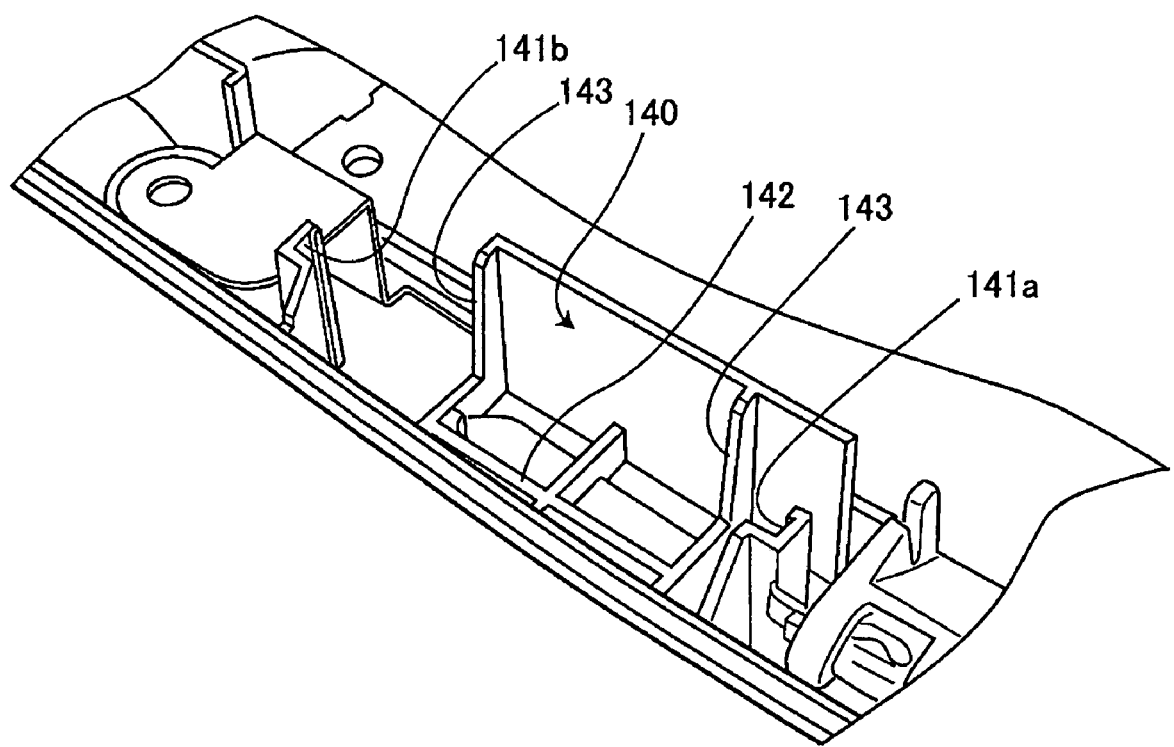
FIG. 17 is a perspective view of a speaker holding section that is formed in the interior of the cabinet of the main unit.

FIG. 17 is a perspective view of a speaker holding section that is formed in the interior of the cabinet of the main unit 10.

This speaker holding section 140 is provided on the inner side of the sound releasing ports 14 that output sound from the built-in speaker, which are shown in FIGS. 1 to 3. The sound releasing port 14 is provided in quantities of two in total, one for each of the right- and left-hand parts of the front of the main unit 10. Also the speaker holding section 140 is provided for each of the two sound releasing ports 14 and the right and left speaker holding sections have almost the same structure. Only one of the two sound releasing ports 14 is shown in FIG. 17.

This speaker holding section 140 has a pair of side guides 141a, 141b that guide both side surfaces of the speaker, a pedestal 142 on which the undersurface of the speaker is placed, and a back 143 that supports the rear surface of the speaker.

Figure 18:
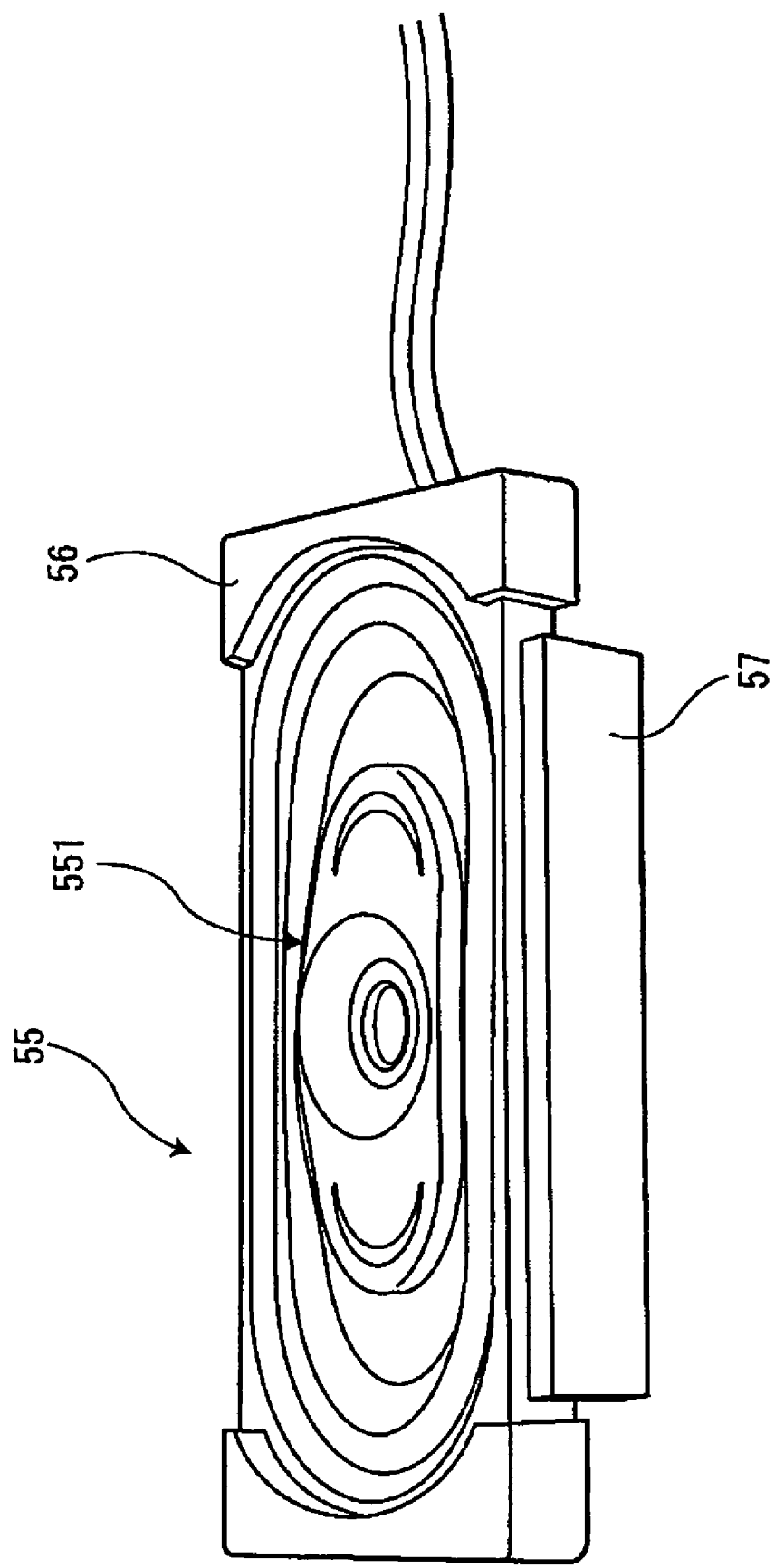
FIG. 18 is a perspective view of a vibrating surface of a speaker as obliquely viewed from above, showing the speaker and cushion members fixed to the speaker.
Figure 19:
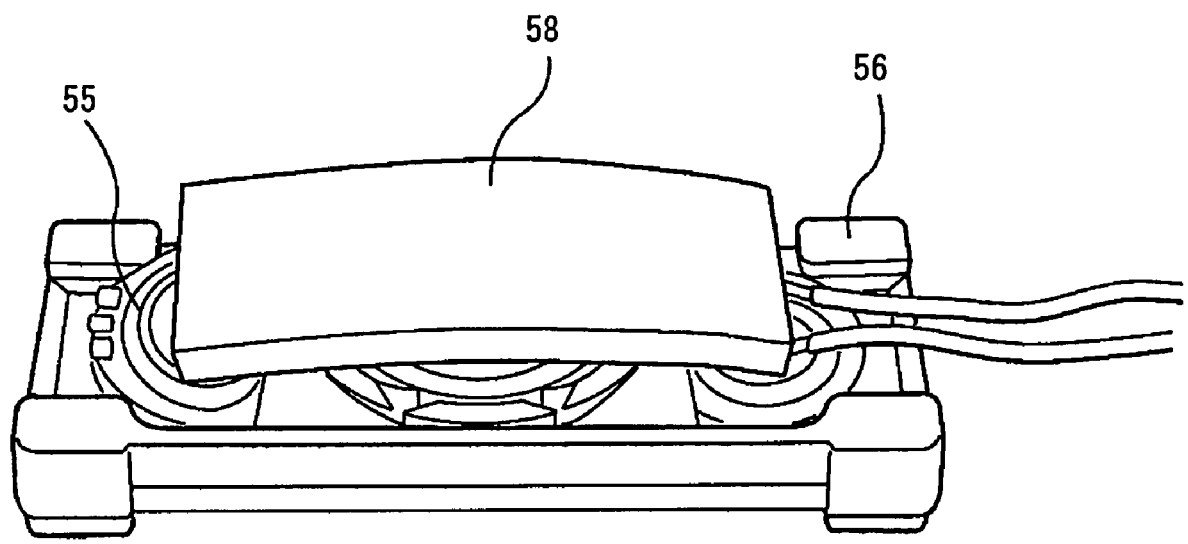
FIG. 19 is a perspective view of the speaker and the cushion members as viewed from the rear surface side, which is a reverse side of the vibrating surface.
Figure 20:
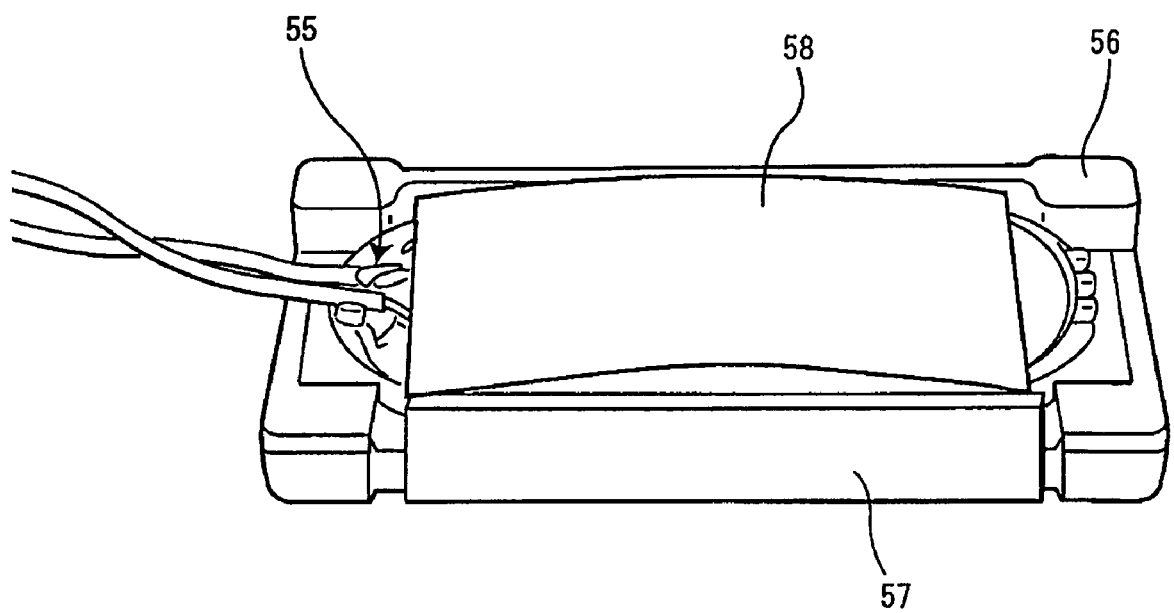
FIG. 20 is a perspective view of the speaker and the cushion members as viewed from a side different from the side of FIG. 19 on the rear surface side.

FIG. 18 is a perspective view of a vibrating surface 551 of a speaker 55 as obliquely viewed from above, showing the speaker 55 and cushion members 56, 57, 58 fixed to the speaker. FIG. 19 is a perspective view of the speaker 55 and the cushion members 56, 57, 58 as viewed from the rear surface side, which is a reverse side of the vibrating surface 551. FIG. 20 is a perspective view of the speaker 55 and the cushion members 56, 57, 58 as viewed from a side different from the side of FIG. 19 on the rear surface side. And FIG. 21 is a perspective view of a first cushion member 56.

As shown in FIG. 18, the vibrating surface 551 of this speaker 55 is oval, but the surface enclosing the vibrating surface 551 on the side of this vibrating surface 551 is rectangular as a whole.

Figure 21:
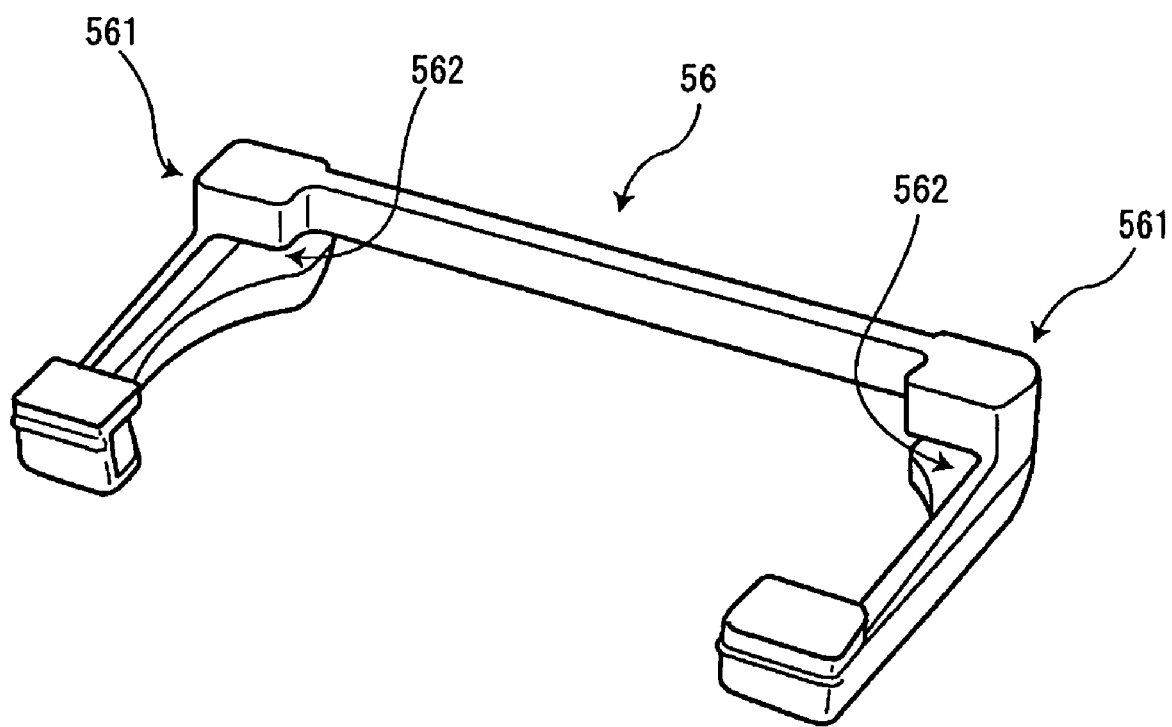
FIG. 21 is a perspective view of a first cushion member.

A first cushion member 56 having the shape as shown in FIG. 21 is disposed on the right and left side surfaces of this rectangular speaker 55, a second cushion member 57 is disposed on the undersurface of the speaker 55, and a third cushion member 58 is disposed on the rear surface of the speaker 55.

The first cushion member 56 of FIG. 21 disposed on the right and left side surfaces of this rectangular speaker 55 is formed in one piece which a pair of fixed portions 561 disposed on the right and left side surfaces of the speaker 55 is connected so as to pass over the top surface of the speaker 55. As a result of this, a reduction in the number of parts and a cost reduction are achieved compared to a case where the right and left fixed portions 561 are separate parts.

In each of the right and left fixed portions 561 of this first cushion member 56, there is formed an insertion portion 562 into which each of the right and left side surfaces of the speaker 55 is to be inserted. This first cushion member 56 is attached to the speaker 55 by the insertion of the right and left side surfaces of the speaker 55 into the right and left insertion portions 562.

This first cushion member 56 is formed from a relatively hard material, such as hard rubber, and hence this first cushion member 56 can be fixed to the speaker 55 simply by inserting the sides of the speaker 55 into the insertion portions 562.

The side guides 141a, 141b of the speaker holding section 140 provided in the cabinet are intended for guiding the side surfaces of the speaker 55 to which the first cushion member 56 is attached, and the first cushion member 56 is configured to hold the speaker 55 in an upward condition such that the vibrating surface 551 of the speaker 55 is directed to the sound releasing port 14 when the speaker 55 with this first cushion member 56 attached thereto is inserted in the side guides 141a, 141b. Thus, this first cushion member 56 is formed from a hard material and has also the role of holding the posture of the speaker 55.

The second cushion member 57 disposed on the undersurface of the speaker 55 is formed from a material that is softer than the material for the first cushion member 56. For this reason, it is impossible to adopt a fixing method that involves fixing by insertion into the undersurface of the speaker 55 as with the material for the first cushion member 56, and this second cushion member 57 is fixed to the undersurface of the speaker 55 by adhesion. This second cushion member 57 has an adhesive layer also on the surface on the pedestal 142 side of the speaker holding section 140, and the second cushion member 57 is made to adhere also to the pedestal 142 when the speaker 55 is disposed in the speaker holding section 140. For this reason, it is possible to prevent, during assembling, the speaker 55 disposed in the speaker holding section 140 from falling off, which eliminates the need of rearrangement of the fallen speaker 55 as well as prevents the occurrence of poor assembling and the like.

Also the third cushion member 58 disposed on the rear surface of the speaker 55 is formed from a material softer than the material for the first cushion member 56 and made to adhere to the rear surface of the speaker 55.

In this embodiment, as described above, the soft cushion members 57, 58 are respectively disposed on the undersurface and rear surface of the speaker 55, and the speaker 55 with the cushion members 56, 57, 58 is disposed in the speaker holding section 140. Thus, transmission of the vibration of the speaker 140 to the cabinet of the main unit 10 is substantially reduced. For this reason, even if the speaker 140 is caused to sound at a great sound volume, it is possible to suppress the influence on the electronic parts of the vibration-sensitive hard disk drive (HDD) unit and the like, which are provided within the cabinet of the main unit 10.

(Mounting Structure of Hard Disk Drive Unit (HDD))

Figure 22:
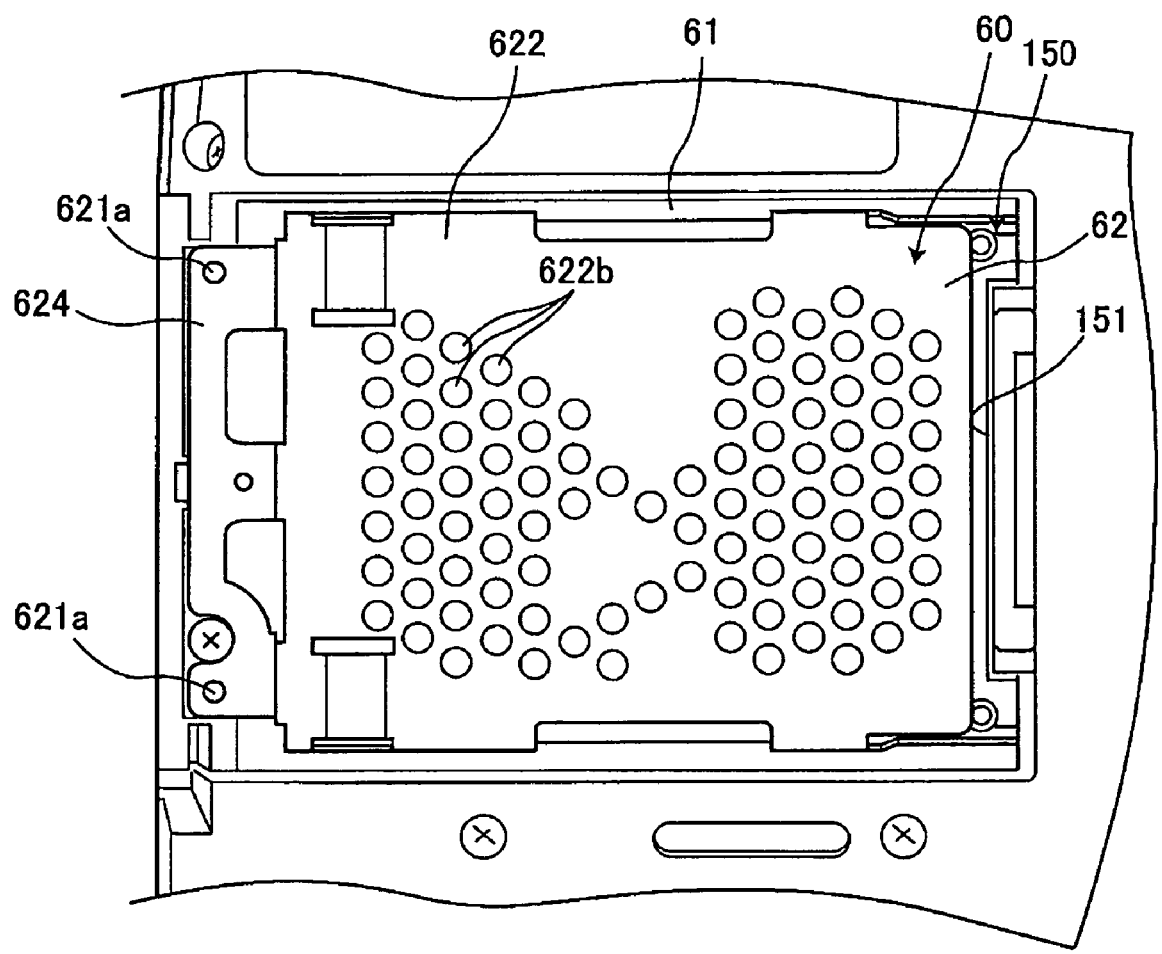
FIG. 22 is a diagram showing an HDD loading section 150 which is opened on the bottom surface of the main unit and into which a hard disk drive (HDD) unit is to be inserted.

FIG. 22 is a diagram showing an HDD loading section 150 which is opened on the bottom surface of the main unit and into which a hard disk drive unit (HDD) is to be inserted.

FIG. 22 shows a condition in which the lid 19 covering the HDD loading section 150 is removed, the HDD loading section 150 having an opening in the bottom surface of the main unit 10 and having a scraped-out shape.

The HDD unit 60 is disposed in the HDD loading section 150. This HDD unit 60 is composed of an HDD main body 61 and a mounting metal fitting 62 for mounting this HDD main body 61 to the cabinet of the main unit 10. This HDD unit 60 is screwed to the cabinet with the aid of holes 621a provided in the mounting metal fitting 62. In FIG. 22 is shown a condition in which screws in the holes 621a have been removed.

Figure 23:
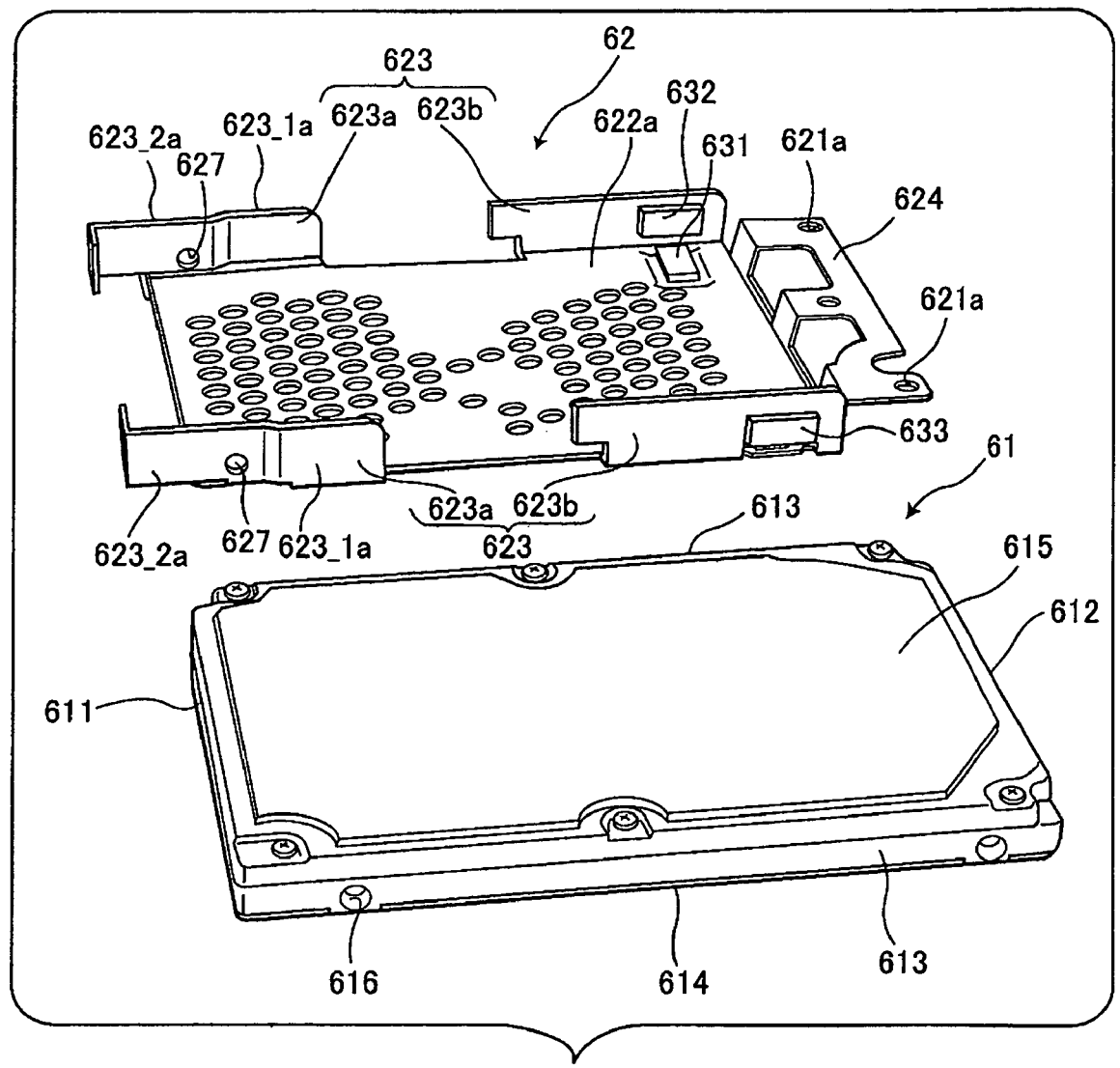
FIG. 23 is a perspective diagram showing the HDD unit disassembled into an HDD main body and a mounting metal fitting.
Figure 24:
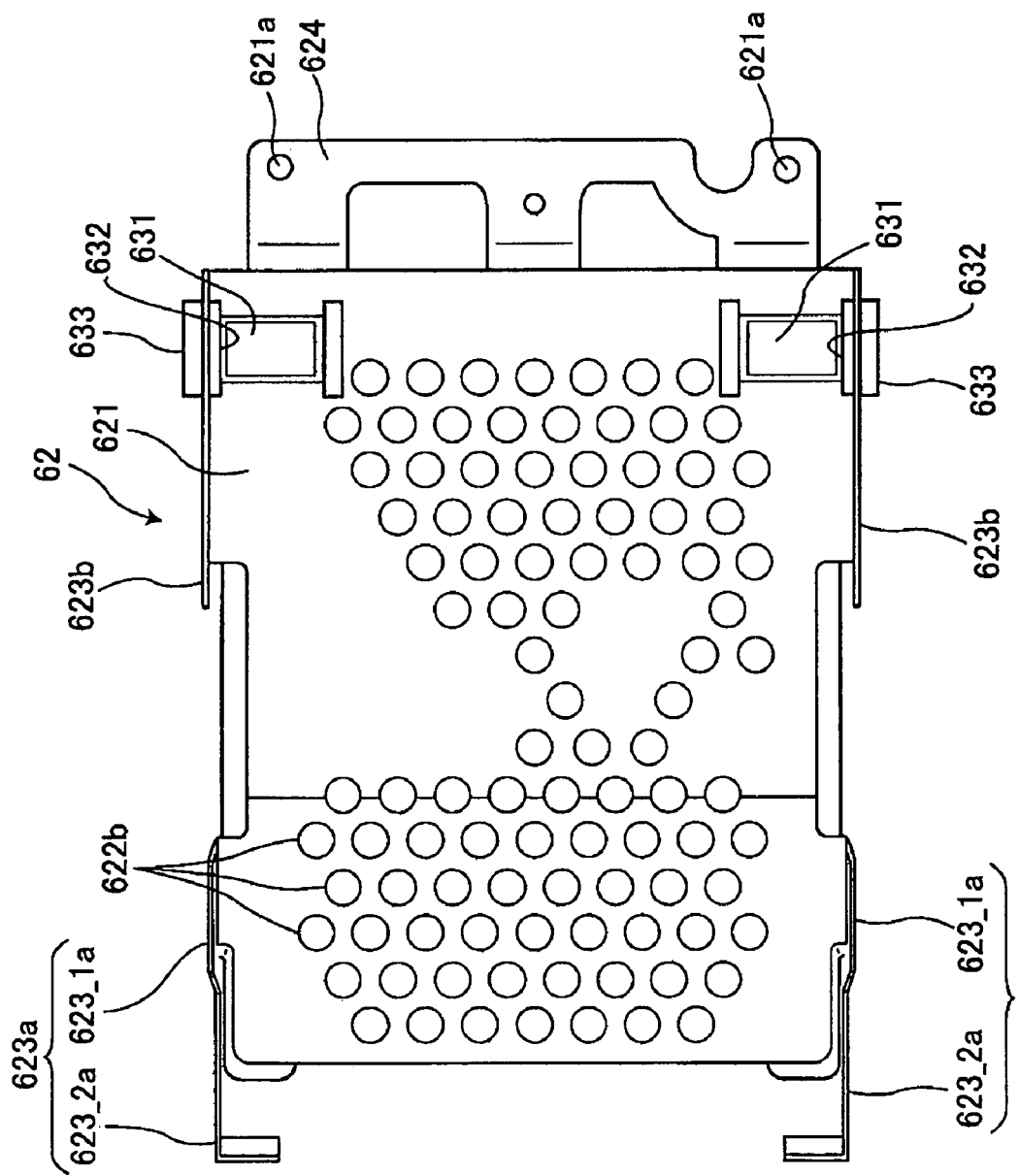
FIG. 24 is a plan view showing the inner surface of the mounting metal fitting.

FIG. 23 is a perspective diagram showing the HDD unit that is disassembled into the HDD main body 61 and the mounting metal fitting 62, and FIG. 24 is a plan view showing the inner surface of the mounting metal fitting 62.

In FIG. 23, an undersurface 615 of the HDD main body 61 and an inner surface 622a of a base portion of the mounting metal fitting 62 are shown in such a manner as to be exposed.

Figure 27:
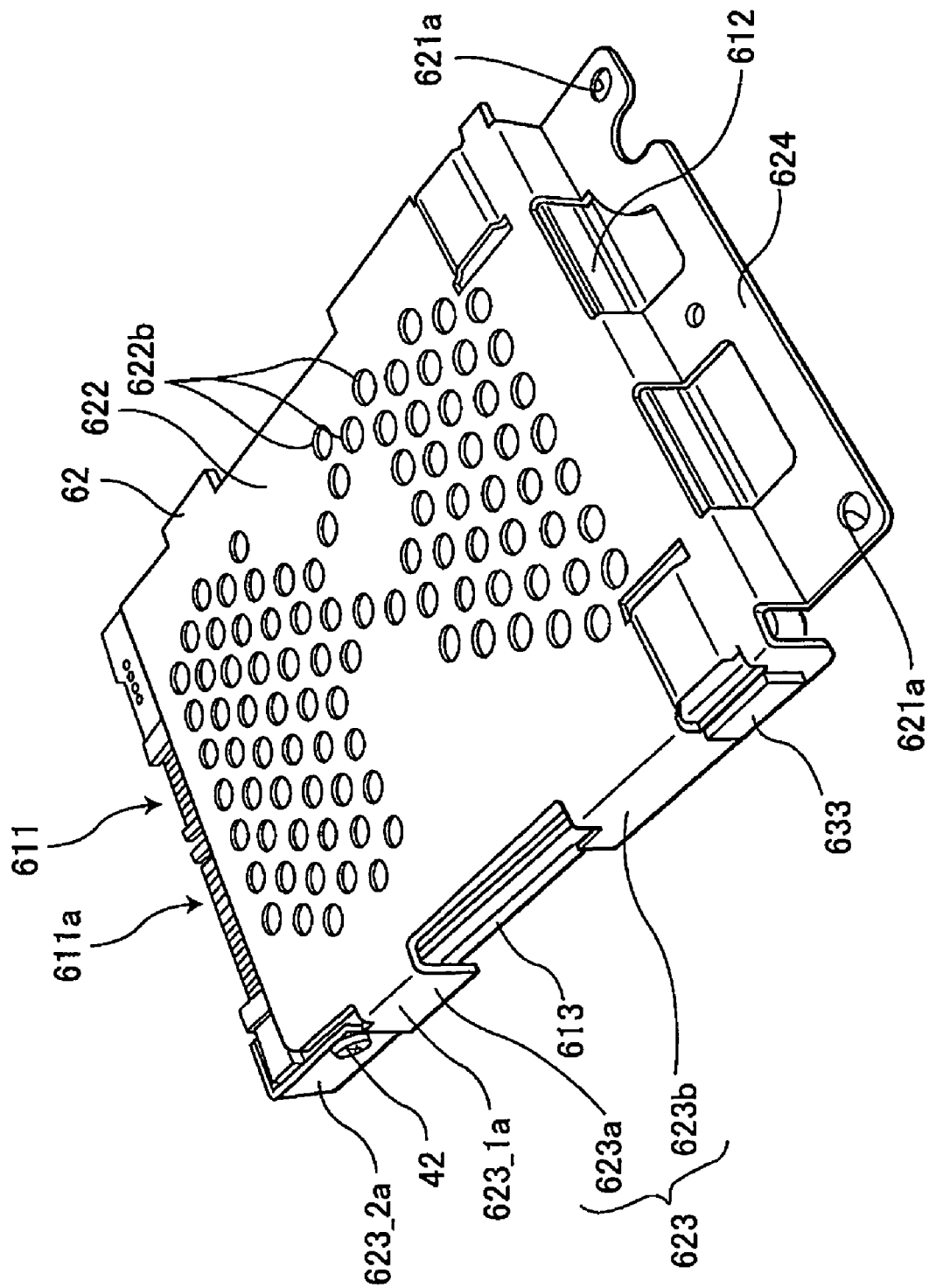
FIG. 27 is a perspective view of the mounting metal fitting attached to the HDD main body, as viewed from an angle at which an overview of the whole structure can be obtained.

This HDD main body 61 is an electronic part in the shape of a flat rectangular parallelepiped having a front end surface 611, a rear end surface 612, two right and left side surfaces 613, a top surface 614 (facing downward in FIG. 23), which is defined by the front end surface 611, the rear end surface 612, and the two side surfaces 613, and an undersurface 615 (facing upward in FIG. 23). In this embodiment, as shown in FIG. 27, a connector 611a is provided in the front end surface 611.

The HDD main body 61 is disposed on the mounting metal fitting 62 so that the top surface 614 thereof faces the inner surface 622a of the base portion of the mounting metal fitting 62. At this time, a cushion member 631 is disposed on the inner surface 622a of the mounting metal fitting 62 so that the top surface 614 of the HDD main body 61 does not directly strike the inner surface 622a of the mounting metal fitting 62. This cushion member 631 is disposed in a position on the inner surface 622a of the mounting metal fitting 62 where a part of the top surface 614 of the HDD main body 61 near the rear end surface side comes into contact. However, on the front end surface side of the HDD main body 61, with the aid of a screw insertion hole 627 of the mounting metal fitting 62 and a screw hole 616 of the HDD main body 61, the mounting metal fitting 62 is screwed to the HDD main body 61 so that a part of the top surface 614 of the HDD main body 61 near the front end surface 611 does not come into direct contact with the inner surface 622a of the mounting metal fitting 62, either.

Also for the side surfaces, in the mounting metal fitting 62, there are disposed cushion members 632 that come into contact with the two side surfaces 613 of the HDD main body 61 at positions near the rear end surface 612. No cushion member is disposed on the side surfaces 613 of the HDD main body 61 at positions near the front end surface 612, because the mounting metal fitting 62 is screwed at these positions.

A cushion member 633 is disposed also on the outer side of the mounting metal fitting 62, such that the mounting metal fitting 62 is interposed between the cushion members 632 and 633. This cushion member 633 on the outer side is placed between the mounting metal fitting 62 and an inner wall of the HDD loading section 150 when the HDD unit 60 in which this mounting metal fitting 62 is attached to the HDD main body 61 is loaded into the HDD loading section 150 (see FIG. 22).

Figure 25:
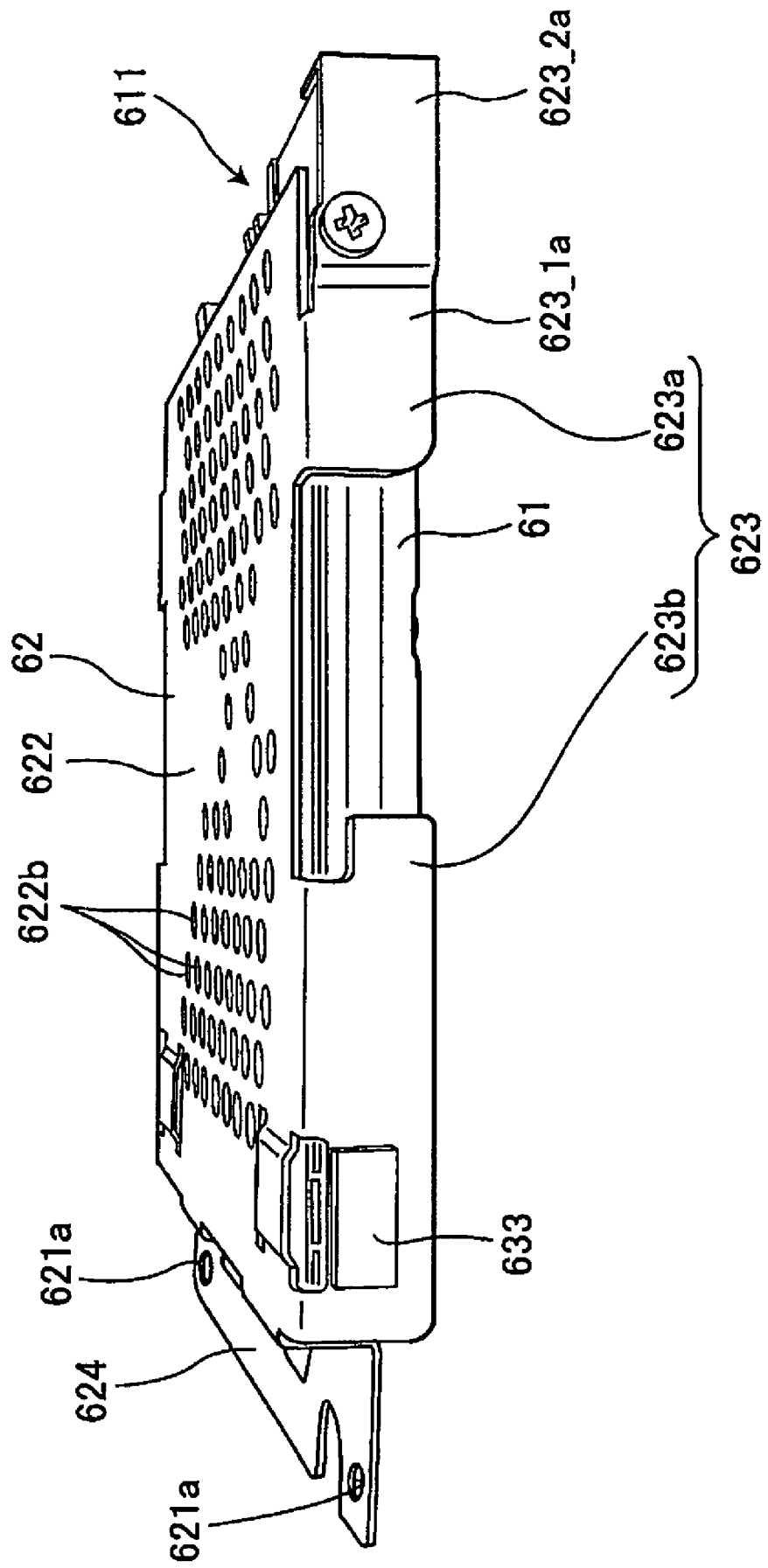
FIG. 25 is a perspective view of the mounting metal fitting attached to the HDD main body, one side surface being viewed, with the front end surface positioned on the right-hand side.
Figure 26:
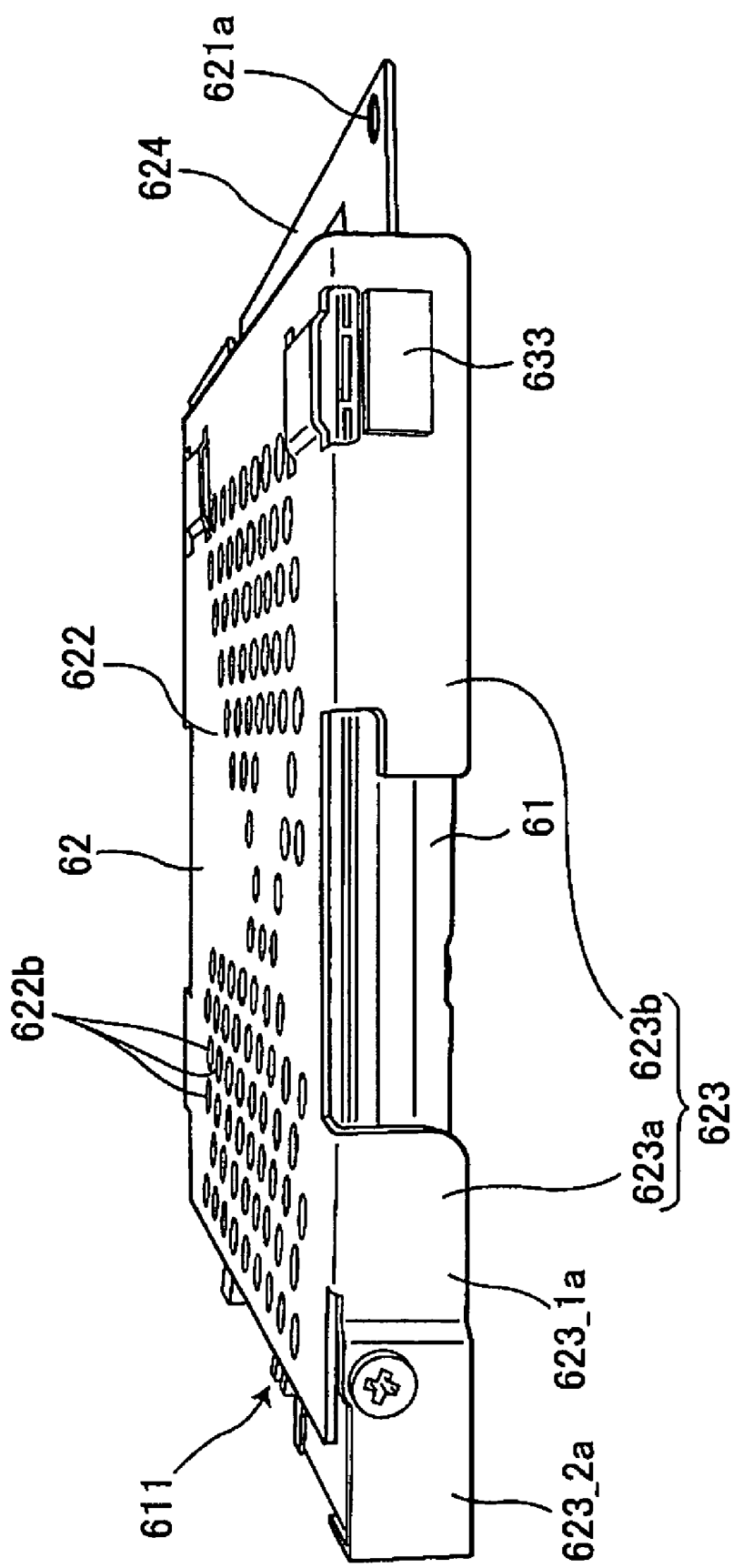
FIG. 26 is a perspective view of the mounting metal fitting attached to the HDD main body, the other side surface being viewed, with the front end surface positioned on the left-hand side.

FIGS. 25 and 26 are perspective views of the mounting metal fitting attached to the HDD main body, showing one side surface and the other side surface respectively, as viewed with the front end surface of the mounting metal fitting positioned on the right-hand side and on the left-hand side of the drawings, respectively. FIG. 27 is a perspective view of the mounting metal fitting attached to the HDD main body, as viewed from an angle at which an overview of the whole structure can be obtained.

This mounting metal fitting 62 is formed by sheet metal working. The mounting metal fitting 62 has a base portion 622 that extends to cover the top surface 614 of the HDD main body 61, and a pair of right and left side surface supporting portions 623 that are bent and extend respectively along the two side surfaces 613 of the HDD main body from the base portion 622. The right and left side surface supporting portions 623 each branch into a front end side surface supporting portion 623a and a rear end side surface supporting portion 623b.

The front end side surface supporting portion 623a is connected to the base portion 622, and has a bent portion 623_1a that is bent from this base portion 622 along the side surface 613 of the HDD main body 61 and an arm portion 623_2a that is separated from the base portion 622, connected to the bent portion 623_1a, extends along the side surface 613 of the HDD main body 61 to the front end surface 611 side, extends up to a corner where the side surface 613 of the HDD main body 61 meets the front end surface 611 thereof, and is further bent to the front end surface 611 side so as to cover the end portion of the front end surface 611. The screw insertion hole 627 for screwing (see FIG. 23) is provided in this arm portion 623_2a, and the arm portion 623_2a is fixed to the HDD main body 61 by use of a screw member 42.

In a position closer to the rear end surface 612 of the HDD main body 61 than the front end side surface supporting portion 623a, the rear end surface side side-supporting portion 623b is connected to the base portion 622 independently of the front end side surface supporting portion 623a, and is bent from the base portion 622 along the side surface 613 of the HDD main body 61 and expands along the side surface 613. Upon an inner surface of this rear end surface side side-supporting portion 623b, there is disposed the cushion member 632 that provides cushioning to the side surface 613 of the HDD main body 61.

Thus, this mounting metal fitting 62 is supported by the cushion members 631, 632 on the rear end surface side of the HDD main body 61 and is screwed in two places in total, one each on the right and left sides, only on the front end surface side. In conventional techniques, for example, screwing is performed on both of the rear end surface side and the front end surface side of the side surface 613 of the HDD main body 61 and both on the right and left sides, i.e., in four places in total. In this embodiment, however, screwing is performed only in the two places of the front end surface side and the mounting metal fitting 62 is supported by the cushion members 631, 632 on the rear end surface side and, therefore, the transmission of the vibration between the HDD main body 61 and the outside is effectively suppressed. Furthermore, in this embodiment, screwing is performed in the arm portion 623_2a of the front end side surface supporting portion 623a and vibrations are absorbed also by this arm portion 623_2a.

Incidentally, this mounting metal fitting 62 is formed so as to be shearable among HDD main bodies having different thicknesses. The above-described cushion member 631 is configured to be caused to adhere to the mounting metal fitting 62 with an adhesive sheet, and the cushion member 631 is selected according to the thickness of an HDD main body to be mounted, whereby the HDD main body is attached to the mounting metal fitting 62. Therefore, no matter what HDD main body is selected, it is possible to mount the HDD main body so as to be kept horizontal.

A large number of holes 622b are provided in the base portion 622 of this mounting metal fitting 62. These holes 622b are intended for achieving weight savings at such a level that does not impair the magnetic shielding, which is one of the roles of this base portion 622.

Furthermore, this mounting metal fitting 62 has a flanged portion 624 that is connected to the base portion 622, is bent from the base portion 622 so as to extend along the rear end surface 612 of the HDD main body 61, and further bent in the reverse direction to extend parallel to the base portion 622. This flanged portion 624 is intended for fixing the HDD unit 60, in which this mounting metal fitting 62 is attached to the HDD main body 61, to the HDD loading section 150 (see FIG. 22) provided in the cabinet of the main unit 10, and is provided with the above-described screw insertion holes 621a.

As shown in FIG. 22, a connector 151 is provided at a front end of the HDD loading section 150. In loading the HDD unit 60 into the HDD loading section 150, the connector 611a (see FIG. 27) on the front end surface 611 of the HDD main body 61 is fitted into the connector 151 at the front end of the HDD loading section 150 in such a manner that the undersurface 615 of the HDD main body 61 faces the bottom surface side of the HDD loading section 150, and the HDD unit 60 is fixed to the cabinet of the main unit 10 by use of a screw member with the aid of a screw insertion hole 621a provided in the flanged portion 624 of the mounting metal fitting 62.

Figure 28:
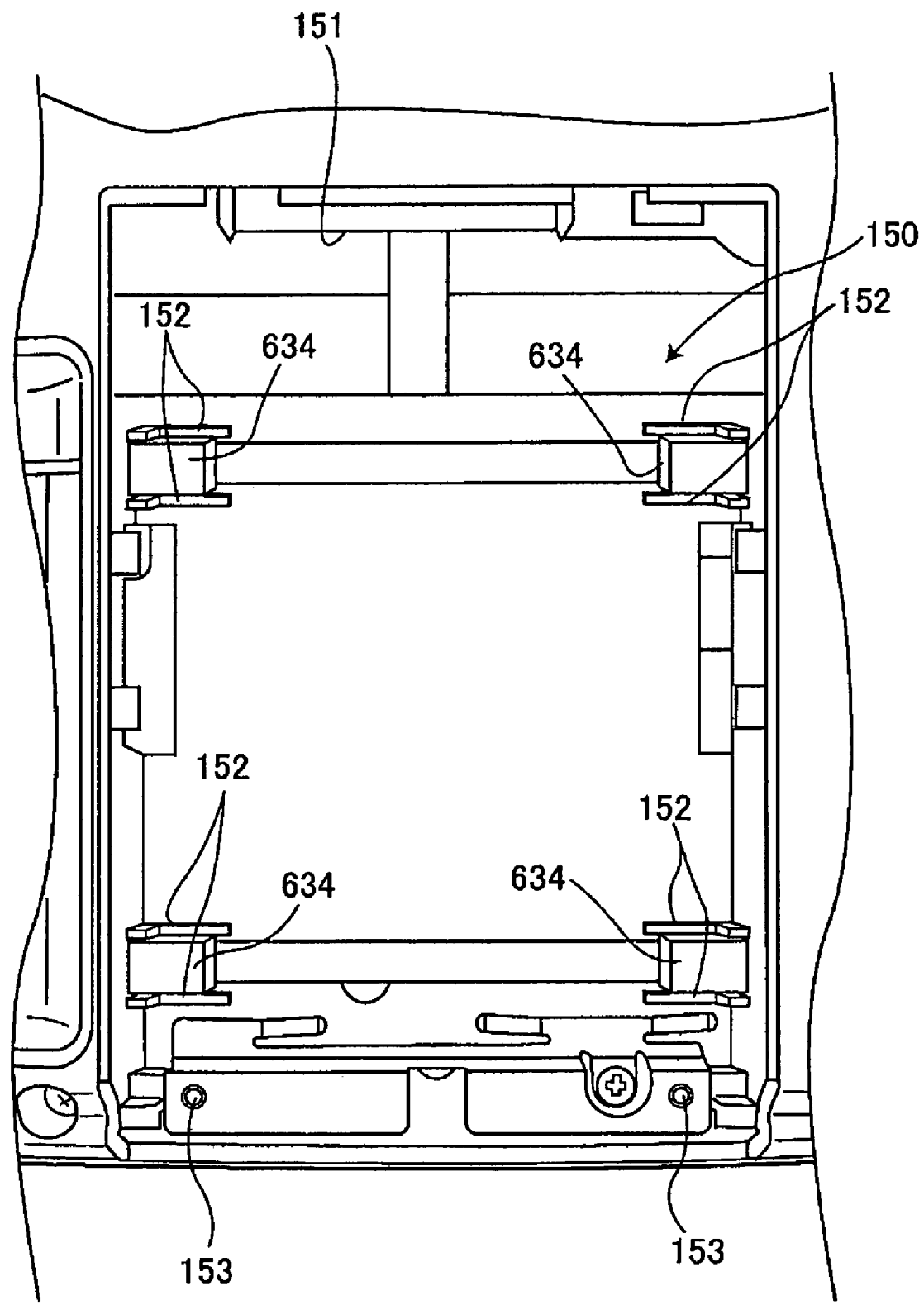
FIG. 28 is a view showing the HDD loading section from which the HDD unit is removed.
Figure 29:
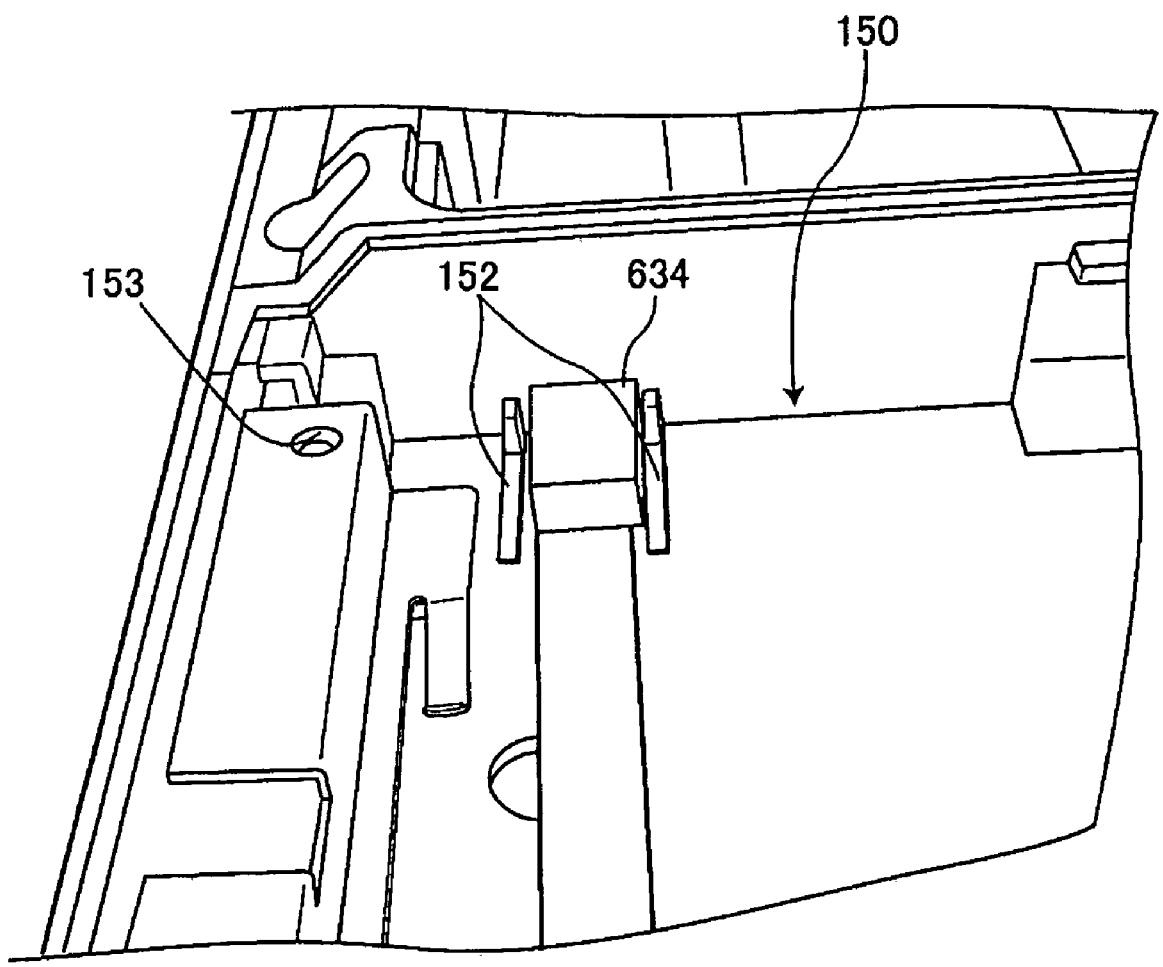
FIG. 29 is a partially enlarged view of part of the HDD loading section.

FIG. 28 is a view showing the HDD loading section from which the HDD unit was removed and FIG. 29 is a partially enlarged view of part of the HDD loading section.

This HDD loading section 150 has an opening on the bottom surface of the main unit and has a shape of a scraped-out interior. The front end of this HDD loading section 150 is provided with a connector 151 that mates with the connector 611a (see FIG. 27) of the HDD unit 60.

Upon the bottom surface of this HDD loading section 150, there are formed pairs of positioning ribs 152 in four places. When the HDD unit 60 is loaded into the HDD loading section 150, the sides of the mounting metal fitting 62 are position-controlled by the positioning ribs 152. A total of four cushion members 634 are disposed in positions sandwiched between the pairs of positioning ribs 152. As shown in FIG. 29, the cushion member 634 has a volume higher than the part of the positioning rib 152 that faces the undersurface 615 of the HDD main body 61. Therefore, the HDD main body 61 is loaded into the HDD loading section 150, with the undersurface 615 of the HDD main body 61 present on the four cushion members 634. Between the HDD unit 60 and the side surfaces of the HDD loading section 150, the cushion members 633 fixed to the outer walls of the rear end surface side side-supporting portion 623 of the mounting metal fitting 62 are placed.

In the rear end edge of the HDD loading section 150, when the HDD unit 60 is loaded into the HDD loading section 150, there are formed two screw holes 153 in positions through which the screw insertion holes 621a of the flanged portion 624 of the mounting metal fitting 62 of the HDD unit 60 are connected. The HDD unit 60 is fixed to the cabinet of the HDD unit 60 by use of screw members through these screw insertion holes 621a and screw holes 153.

As described above, on the right and left side surfaces of the HDD main body 61, the mounting metal fitting 62 is fixed by use of screws only in two places in total, one each on the right and left sides near the front end surface, and the rear end surface side of the HDD main body 61 is supported by the mounting metal fitting 62 via the cushion members 631, 632. For this reason, the HDD main body 61 has high allowable levels of vibration for the mounting metal fitting 62. This HDD main body 61 has a mechanically vibrating part inside of which a head moves above a rotating a hard disk (HD), which is a storage medium, to make access. Therefore, the HDD main body 61 itself generates vibration and is apt to malfunction when it receives vibration from the outside. In this embodiment, the HDD main body 61 has high allowable levels of vibration for the mounting metal fitting 62 owing to the above-described structure and, therefore, the transmission of vibration is substantially suppressed. Furthermore, also between the HDD unit 60 and the HDD loading section 150, there are provided the four cushion members 634 on the bottom surface of the HDD loading section 150 and the two cushion members 633 on the rear end side of the right and left side surfaces of the HDD unit 60, whereby allowable levels of vibration are raised.

Therefore, with this structure, mechanical vibration is less apt to be transmitted between the cabinet of the main unit 10 and the HDD main body 61, malfunctions of the HDD main body 61 due to the impact and vibration from the outside are suppressed, and the adverse effect of the vibration of the HDD main body 61 on other parts is also suppressed.

(Electronic Part Mounting Structure)

Figure 30:
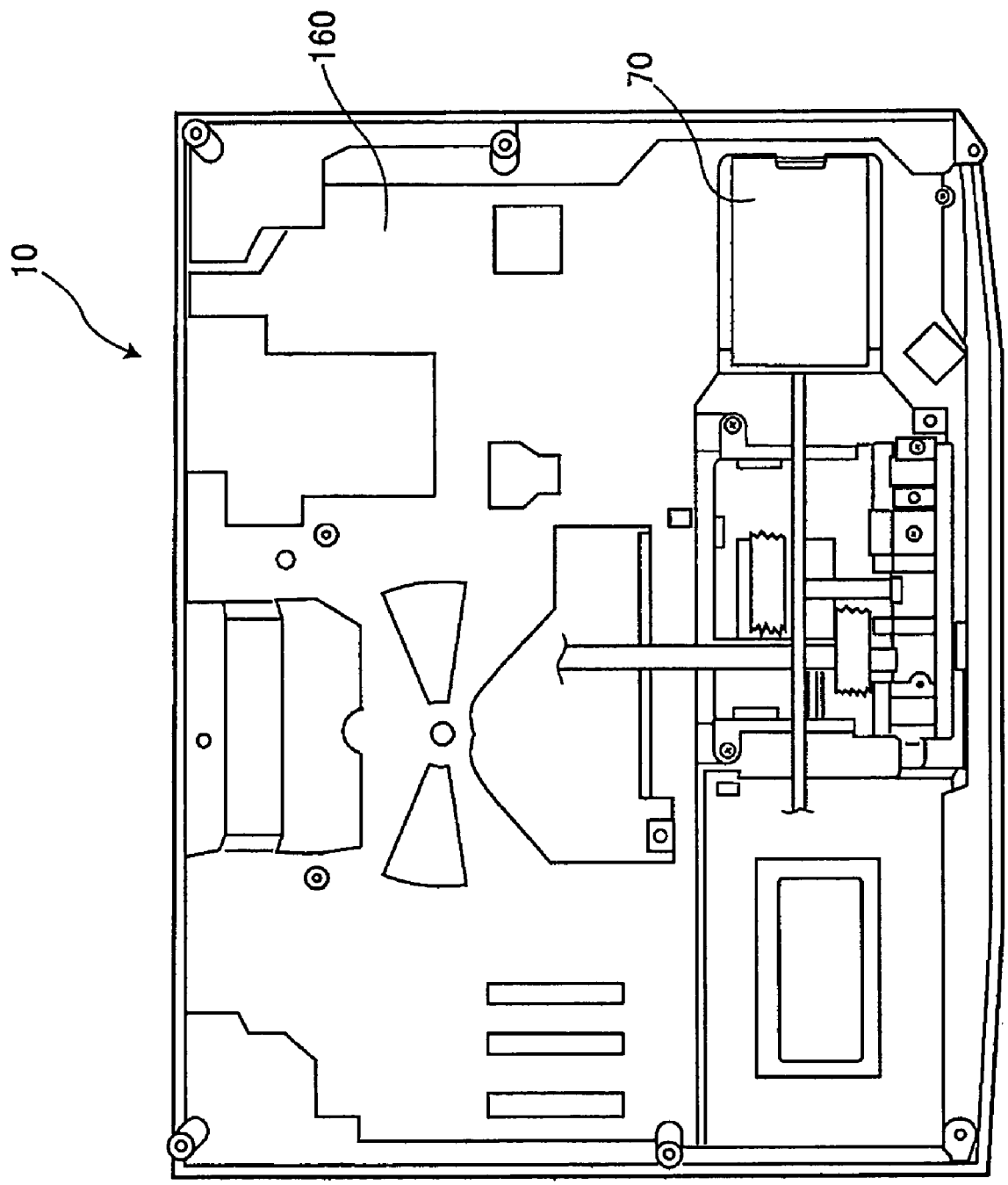
FIG. 30 is a diagram showing a shield plate that extends under a keyboard and the like constituting the top surface of the main unit, the keyboard and the like being removed.

FIG. 30 is a diagram showing a shield plate that extends under the keyboard 11 (see FIG. 1) and the like constituting the top surface of the main unit 10, with the keyboard and the like being removed. This shield plate 160 is formed by sheet metal working.

A description will be given here of a mounting structure of a plate-like electronic part 70 using this shield plate 160.

Figure 31:
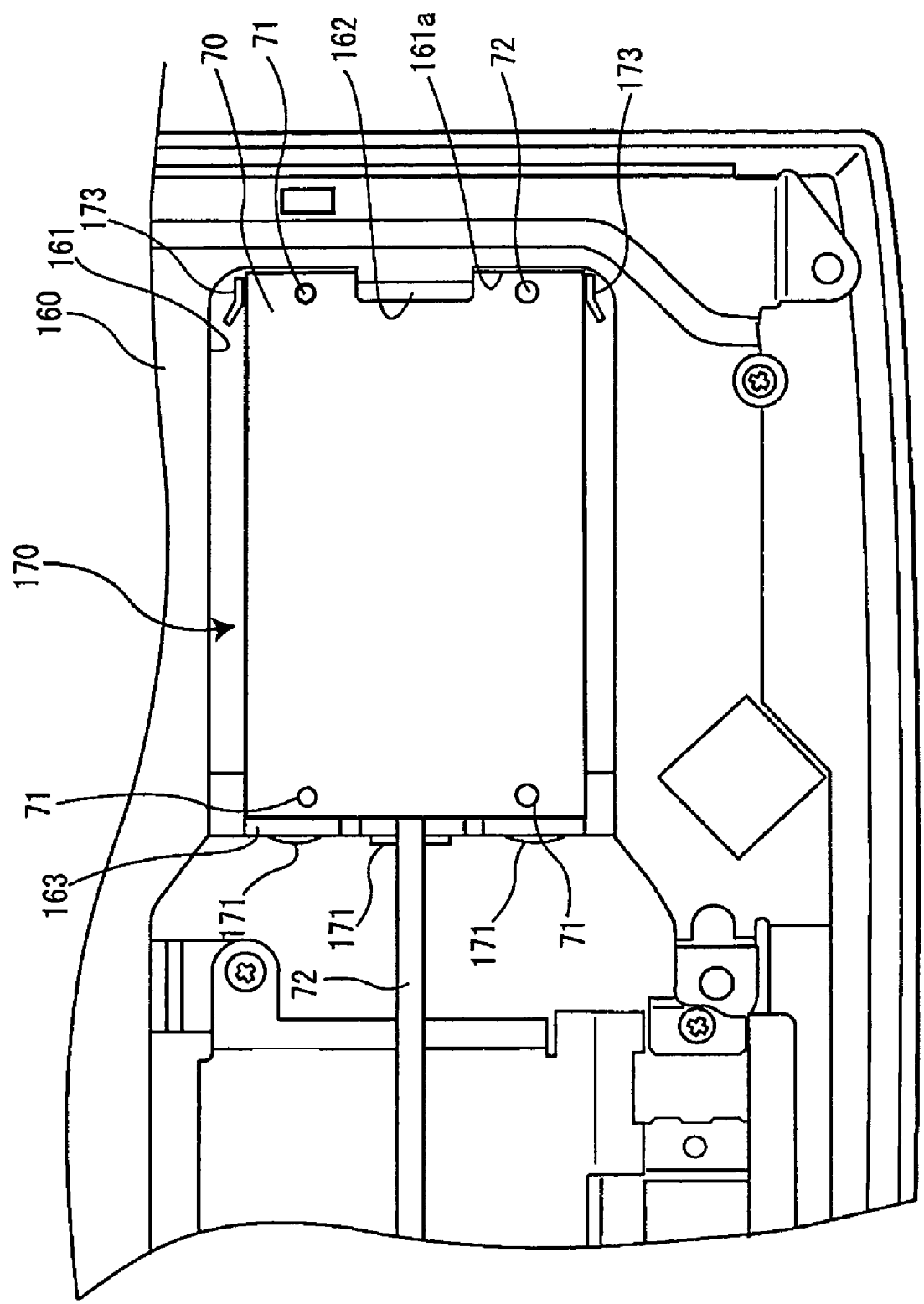
FIG. 31 is an enlarged diagram showing the area of the electronic part in FIG. 30.
Figure 32A:
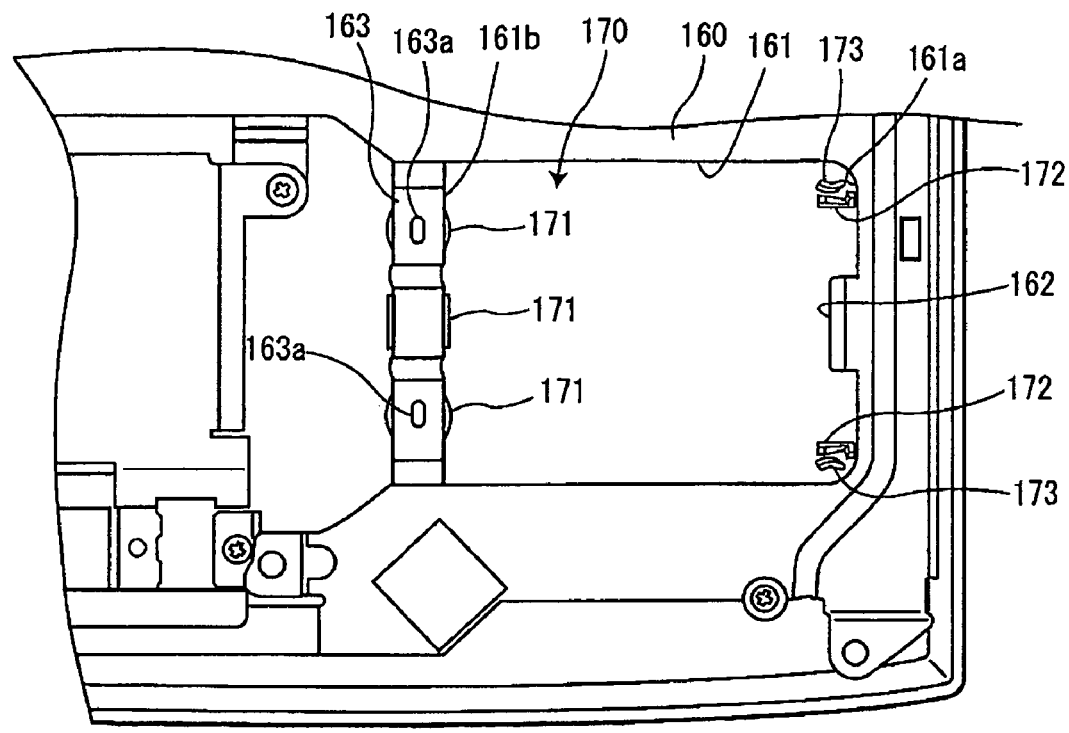
FIGS. 32(A) to 32(C) are diagrams of the same area of FIG. 31, showing an electronic part arrangement region where the electronic part is to be arranged, and the electronic part being removed.
Figure 32B:
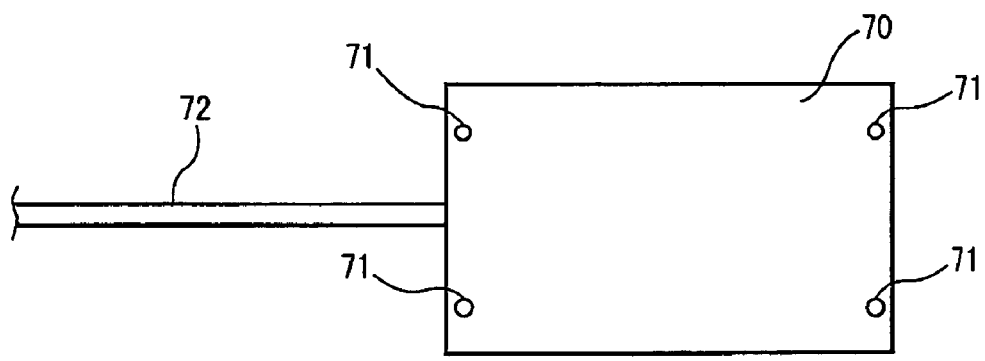
Figure 32C:
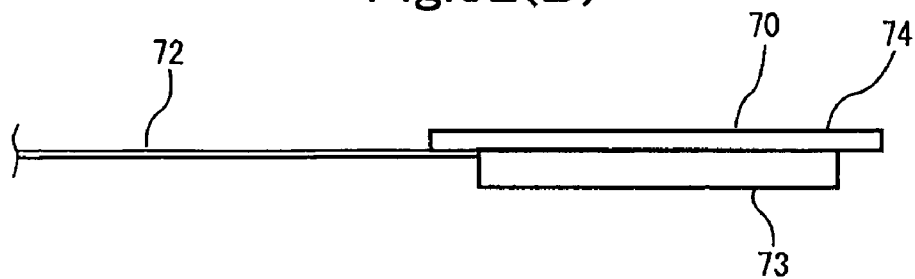

FIG. 31 is an enlarged diagram showing the area of the electronic part in FIG. 30, and FIGS. 32(A) to 32(C) are diagrams of the same area of FIG. 31, showing an electronic part arrangement region where the electronic part is to be arranged, with the electronic part being removed. FIG. 32(A) is a plan view of the electronic part arrangement region, FIG. 32(B) is a plan view of the electronic part, and FIG. 32(C) is a front view of the electronic part.

This electronic part 70 is an electronic part in which a communication circuit is built and has a rectangular shape as shown in FIG. 32(B). However, in the thickness direction, as shown in FIG. 32(C), the electronic part 70 is composed of a communication module 73 and a supporting plate 74 that is fixed to the communication module 73 and that has an area wider than that of the communication module 73. Screwing through holes 71 are formed in the four corners of the supporting plate 70, and a cable 72 that assumes the role of signal transmission to and from the outside of this electronic part 70 extends from the communication module 73.

On the other hand, in the electronic part arrangement region 170 in which this electronic part 70 is to be arranged, an opening 161 is provided in the shield plate 160 and an overhanging piece 162 that hangs over into this opening 161 is provided in a front end edge 161a of this opening 161 (the end edge on the right side of FIGS. 31 and 32). The rear end of the opening 161 is divided by a strip-shaped portion 163, which is formed by part of the shield plate 160 that extends like a strip, and a rear end edge 161b of the opening 161 is formed by the strip-shaped portion 163. The strip-shaped portion 163 of this shield plate 160 is supported from below by three bosses 171, which are provided in a standing manner in the inner wall of the bottom surface of the cabinet of the main unit 10 (see FIG. 1). A screw hole (not shown) is formed in each of the bosses on both sides among these three bosses 171, in the middle portion of the boss. A screw insertion hole 163a is formed in each part of the strip-shaped portion 163 of the shield plate 160 such that the screw insertion hole 163a overlaps with the above screw hole.

These screw holes and screw insertion holes 163a are formed in positions such that they overlap with the two through holes provided on the rear end side, of the four through holes 71 formed in the electronic part 70, when the electronic part 70 is placed in this electronic part arrangement region 170. The two through holes 71 on the front end side of this electronic part 70 are not used here.

As described above, the overhanging piece 162 that hangs over into this opening 161 is provided in the shield plate 160. This hanging-over piece 162 assumes the role of supporting the top surface of the electronic part 70. However, because this hanging-over piece 162 hangs over into the opening 161, this hanging-over piece 162 becomes an obstacle when the electronic part 70 is placed from above. Furthermore, even if this electronic part 70 is to be placed by being caused to slide laterally in such a manner that the front end of the electronic part 70 comes under the overhanging piece 162, this communication module 73 may strike the strip-shaped portion 163 of the shield plate 160, because this electronic part 70 has such a shape that, as shown in FIG. 32(C), only the front end portion and the rear end portion are thin and the middle portion is thick by having the communication module 73 fixed thereto. Therefore, it is considerably difficult to dispose this electronic part 70 by causing the electronic part 70 to slide laterally. Accordingly, in this embodiment, the following configuration is contrived.

Figure 33:
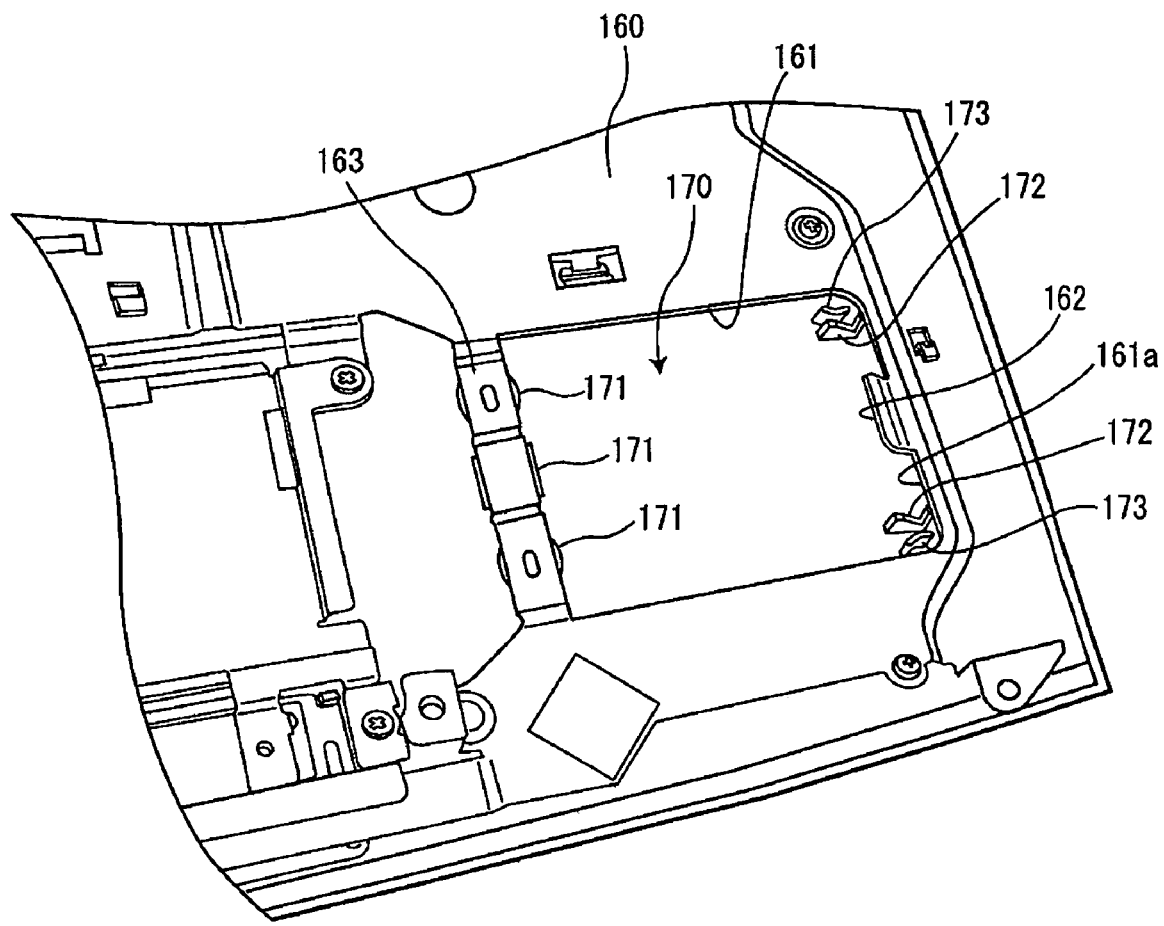
FIG. 33 is a perspective view of the electronic part arrangement region as obliquely viewed from above.
Figure 34:
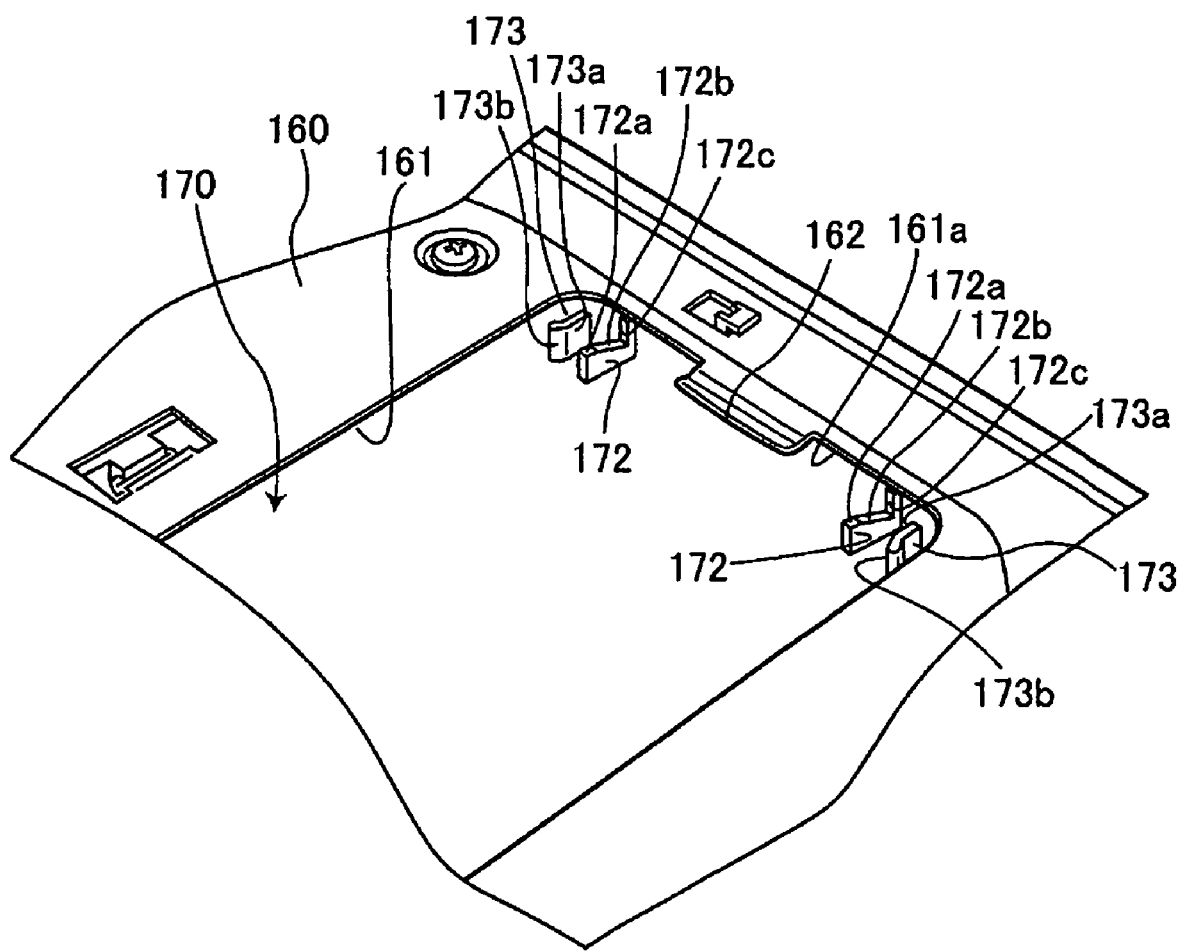
FIG. 34 is an enlarged view of a front end portion of the electronic part arrangement region.

FIG. 33 is a perspective view of the electronic part arrangement region as obliquely viewed from above and FIG. 34 is an enlarged view of a front end portion of the electronic part arrangement region.

In the front end portion of this electronic part arrangement region 170, undersurface guiding ribs 172 provided in a standing manner from the inner wall of the bottom surface of the cabinet are disposed on both sides of the overhanging piece 162 and side surface guiding ribs 173 provided in a standing manner from the inner wall of the bottom surface of the cabinet are further disposed in positions where these two undersurface guiding ribs 172 are interposed.

The top surface of the undersurface guiding rib 172 is composed of a support surface 172a and an inclined surface 172b, and an abutment wall 172c is formed in a position at the base of this inclined surface 172b.

This inclined surface 172b is an inclined surface that inclined downward to the front end edge 161a of the opening 161, and guides the front end undersurface of the electronic part 70 when the electronic part 70 is inserted obliquely downward to the front end edge 171a.

The support surface 172a is formed adjacent to the inclined surface 172b at a position more spaced from the front end edge 161a than the inclined surface 172b, and supports the front end undersurface of the electronic part 70 when the electronic part 70 is made horizontal by lowering the rear end side of the electronic part 70 that is guided to the inclined surface 172b and inserted obliquely downward. When the undersurface of the electronic part 70 is supported by this support surface 172a and the electronic part 70 is placed horizontally, the top surface of this electronic part 70 on the front end side is supported by the overhanging piece 162.

Furthermore, the abutment wall 172c is intended for receiving abutment by the front end of the electronic part 70 that is guided to the inclined surface 172b and inserted obliquely downward and performing positioning of this electronic part 70 in the fore-and-aft direction.

The hanging-over piece 162 has such a shape that the front end thereof is bent obliquely upward, and thus aids to insert the electronic part 70 obliquely downward.

The side surface guiding ribs 173 are intended for guiding the two right and left side surfaces on the front end side of the electronic part 70 inserted obliquely downward to the front end edge 161a of the opening 161, and have guide walls 173a, which extend parallel to each other due to the pair of side surface guiding ribs 173, and introduction walls 173b, which are formed at a position more spaced than the guide walls 173a from the front end edges 161a of the opening 161 and open mutually toward a direction spaced from the front end edges 161a.

The guide walls 173a are intended for controlling the lateral direction of the electronic part 70 by guiding the sides of the electronic part 70 to correct positions, and the introduction walls 173b are intended for delivering the electronic part 70 to the guide walls 173a while correcting the lateral positions of the side surfaces of the electronic part 70, which has been inserted into a position somewhat laterally shifted, by guiding the side surfaces of the electronic part 70.

Figure 35:
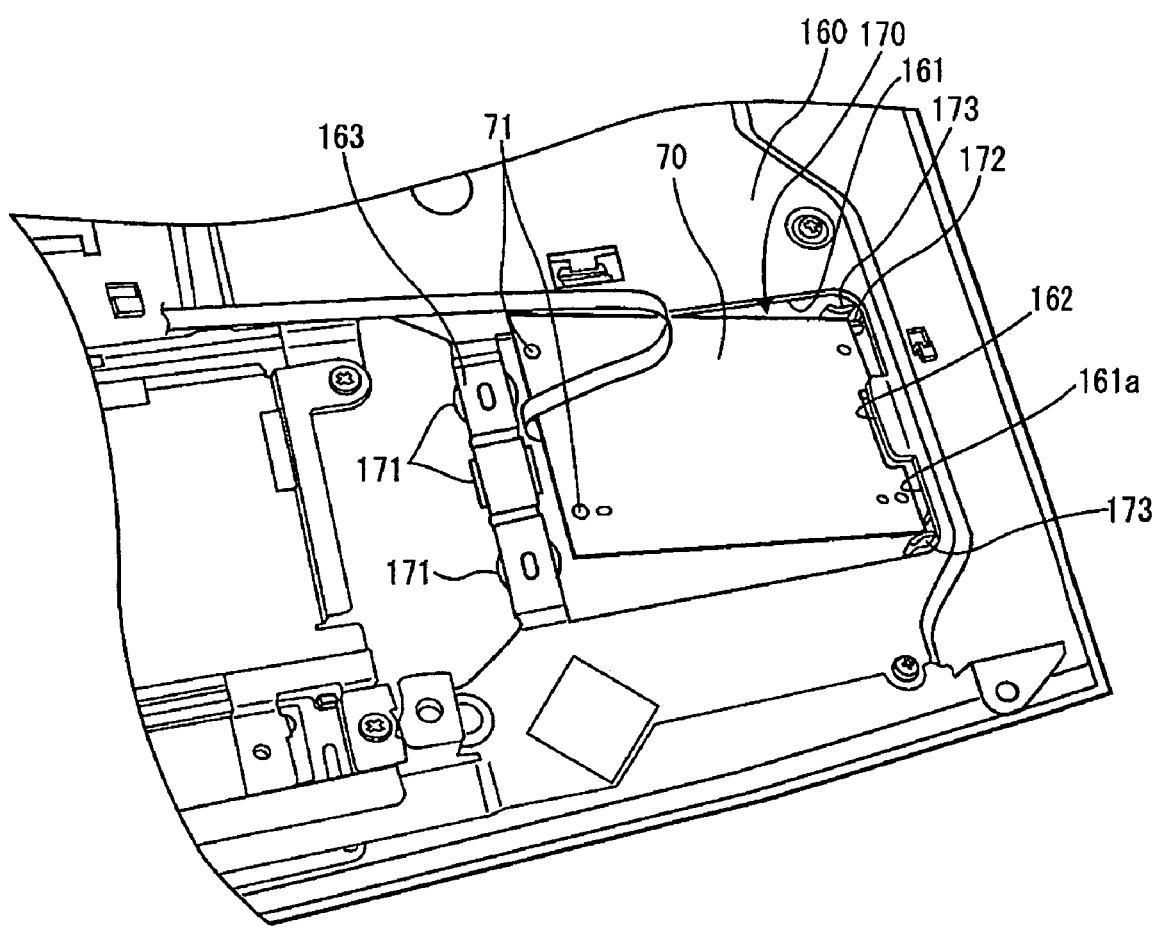
FIG. 35 is a view showing the electronic part inserted obliquely into the electronic part arrangement region.
Figure 36:
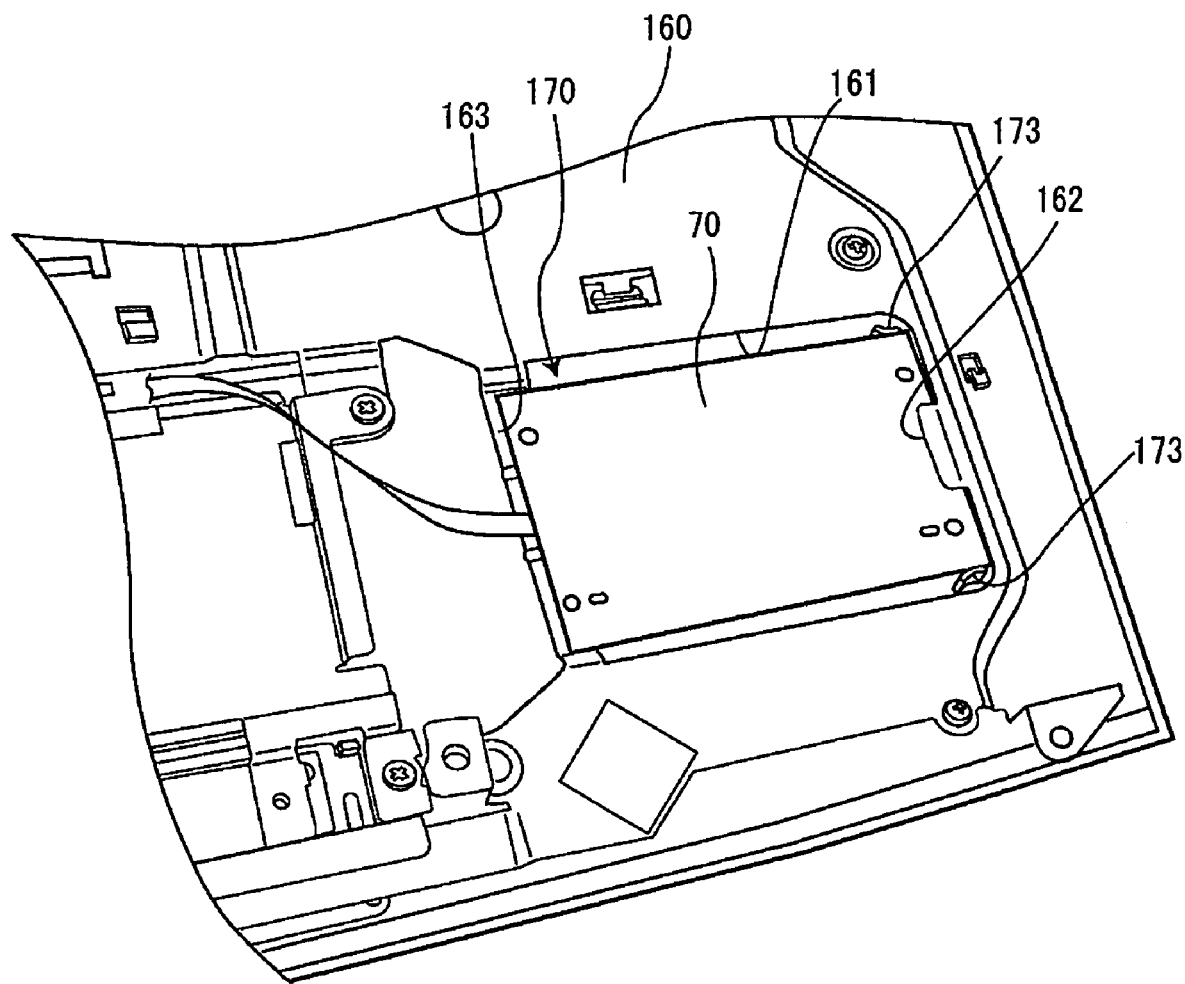
FIG. 36 is a view showing the inserted electronic part that is horizontally placed.

FIG. 35 is a view showing the electronic part inserted obliquely into the electronic part arrangement region and FIG. 36 is a view showing the inserted electronic part that is horizontally placed.

In this embodiment, for the lateral direction of the electronic part 70, the electronic part 70 inserted obliquely downward is guided with the aid of the inclined surfaces 172b of the undersurface guiding ribs 172 while performing position control with the aid of the side surface guiding ribs 173 and the front end of the electronic part 70 is caused to abut against the abutment wall 172c, whereby the fore-and-aft positions are determined. Thereafter, the electronic part 70 is horizontally placed, whereby for the front end side of the electronic part 70, the undersurface is caused to be supported by the support surfaces 172a of the undersurface guiding ribs 172 and the top surface is caused to be supported by the overhanging piece 162. In this condition, screwing to the bosses that stand on the bottom surface of the cabinet is performed with the aid of the through holes 71 on the rear end side of the electronic part 70.

As described above, in this embodiment, the electronic part 70 inserted obliquely downward is guided by providing the undersurface guiding ribs 172 and, therefore, it is possible to easily dispose the electronic part 70 in a correct place in the electronic part arrangement region 170 which improves assembling efficiency.

What is claimed is:

1. An electronic device formed by a cabinet having a surface, the electronic device comprising:
   an undersurface guiding rib that guides a front end of an undersurface of a tabular electronic part, a top surface of the undersurface guiding rib being formed by an inclined surface and a supporting surface, the inclined surface extending in the direction across the surface of the cabinet and being inclined in a moving direction of the electronic part toward the surface of the cabinet, the supporting surface being formed at a position upstream in the moving direction of the electronic part toward the inclined surface and supporting the front end of the undersurface of the electronic part when the electronic part is guided by the inclined surface and made horizontal with a rear end of the electronic part made lowered; and
   an overhanging piece that is disposed at a position above the undersurface guiding rib and supports a top surface on the front end of the electronic part that is made horizontal with the undersurface of the electronic part being supported by the supporting surface of the undersurface guiding rib.

2. The electronic device according to claim 1, further comprising a plate member that extends on the surface of the cabinet and that has an opening in which the electronic part is placed,
   wherein the undersurface guiding rib is disposed in the cabinet at a position near an end edge defined by the opening, and the plate member has the overhanging piece that overhangs toward the inside of the opening from the end edge.

3. The electronic device according to claim 1, wherein the overhanging piece is in such a shape that a tip of the overhanging piece is bent obliquely upward.

4. The electronic device according to claim 1, wherein the undersurface guiding rib further has an abutment wall, at the bottom of the inclined surface, against which a tip of the electronic part guided by the inclined surface abuts.

5. The electronic device according to claim 1, wherein the undersurface guiding rib is formed by a pair of undersurface guiding ribs that guide the undersurface of the electronic part to positions respectively near side surfaces of the electronic device.

6. The electronic device according to claim 2, further comprising a pair of side surface guiding ribs that guide right and left side surfaces on the front end side of the electronic part guided by the inclined surface.

7. The electronic device according to claim 6, wherein the side surface guiding ribs further have guide walls that guide the side surfaces of the electronic part and extend parallel to each other, and introduction walls that are formed continuous to the guide walls at a position distant from the end edge of the opening further than the guide walls are and open mutually toward a direction away from the end edge, and guide the side surfaces of the electronic part to the guide walls.

8. The electronic device according to claim 2, wherein the electronic part further comprises a fixing through hole formed in the rear end of the electronic part, and the cabinet further comprises a boss with a screw hole formed therein that stands at a position corresponding to the through hole when the electronic part is placed in the cabinet, and the electronic part is fixed by a screw member that is passed through the through hole and screwed into the screw hole of the boss.

9. The electronic device according to claim 8, wherein the plate member has an opening that extends over the boss and is formed in a position corresponding to the screw hole of the boss through which the screw member is inserted.

10. The electronic device according to claim 2, wherein the plate member is a sheet metal member.

11. The electronic device according to claim 1, further comprising an arithmetic processing unit that incorporates an arithmetic circuit performing arithmetic processing and that is provided, on a top surface thereof, with a keyboard that inputs instructions according to operations, wherein the cabinet is a cabinet of the arithmetic processing unit.

12. The electronic device according to claim 11, further comprising, in addition to the arithmetic processing unit, a display unit that has a display screen displaying information and that is connected to the arithmetic processing unit so as to be capable of being opened and closed.

\* \* \* \* \*